(12) United States Patent
Kumar et al.

(10) Patent No.: US 12,322,619 B2
(45) Date of Patent: Jun. 3, 2025

(54) DYNAMIC PROCESS CONTROL IN SEMICONDUCTOR MANUFACTURING

(71) Applicant: Lam Research Corporation, Fremont, CA (US)

(72) Inventors: Purushottam Kumar, Hillsboro, OR (US); Tengfei Miao, San Jose, CA (US); Gengwei Jiang, Tigard, OR (US); Daniel Ho, Camas, WA (US); Joseph R. Abel, West Linn, OR (US); Siddappa Attur, Beaverton, OR (US); Pulkit Agarwal, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 495 days.

(21) Appl. No.: 17/634,214

(22) PCT Filed: Aug. 11, 2020

(86) PCT No.: PCT/US2020/045794
§ 371 (c)(1),
(2) Date: Feb. 9, 2022

(87) PCT Pub. No.: WO2021/030364
PCT Pub. Date: Feb. 18, 2021

(65) Prior Publication Data
US 2022/0293442 A1    Sep. 15, 2022

Related U.S. Application Data

(60) Provisional application No. 62/885,667, filed on Aug. 12, 2019.

(51) Int. Cl.
*H01L 21/67* (2006.01)
*G05B 19/418* (2006.01)

(52) U.S. Cl.
CPC .. *H01L 21/67253* (2013.01); *G05B 19/41875* (2013.01); *G05B 2219/32368* (2013.01)

(58) Field of Classification Search
CPC ............... H01L 21/67253; H01L 21/67; H01L 21/0228; H01L 21/68771; H01L 21/67017;
(Continued)

(56) References Cited

U.S. PATENT DOCUMENTS

| 2003/0143747 A1 | 7/2003 | Bondestam et al. |
| 2006/0281184 A1 | 12/2006 | Bondestam et al. |

(Continued)

FOREIGN PATENT DOCUMENTS

| CN | 114222830 | 3/2022 |
| JP | 2003286575 | 10/2003 |

(Continued)

OTHER PUBLICATIONS

"International Application Serial No. PCT US2020 045794, International Preliminary Report on Patentability mailed Feb. 24, 2022", 7 pages.

(Continued)

*Primary Examiner* — Nikolay K Yushin
(74) *Attorney, Agent, or Firm* — Schwegman Lundberg & Woessner, P.A.

(57) ABSTRACT

Methods and system are provided for dynamic process control in substrate processing, for example in semiconductor manufacturing applications. Some example systems and methods are provided for advanced monitoring and machine learning in atomic layer deposition (ALD) processes. Some examples also relate to dynamic process control and monitoring for chamber parameter matching and gas line charge times.

21 Claims, 25 Drawing Sheets

(58) Field of Classification Search
CPC ......... H01L 21/76828; H01L 21/76811; H01L 21/76813; H01L 21/68711; H01L 21/02631; G05B 19/41875; G05B 19/418; G05B 2219/32368; G05B 19/4155; G05B 19/4183; C23C 16/45536; C23C 16/455; C23C 16/45544; C23C 16/45557; C23C 16/45561; C23C 16/5096; C23C 16/509; C23C 16/52; C23C 16/45525; C23C 16/05; C23C 16/279

See application file for complete search history.

(56) References Cited

U.S. PATENT DOCUMENTS

| | | |
|---|---|---|
| 2008/0264337 A1 | 10/2008 | Sano et al. |
| 2009/0325386 A1 | 12/2009 | Devine et al. |
| 2012/0269968 A1 | 10/2012 | Rayner, Jr. |
| 2013/0081702 A1 | 4/2013 | Mohammed et al. |
| 2019/0062914 A1 | 2/2019 | King et al. |

FOREIGN PATENT DOCUMENTS

| | | |
|---|---|---|
| JP | 2012216697 | 11/2012 |
| JP | 2017085088 | 5/2017 |
| JP | 2022544932 | 10/2022 |
| KR | 20110022036 A | 3/2011 |

OTHER PUBLICATIONS

"Chinese Application Serial No. 202080057459.9, Response filed Apr. 23, 2024 to Office Action mailed Dec. 8, 2023", w current English claims, 6 pgs.

International Application Serial No. PCT/US2020/045794, International Search Report mailed Nov. 27, 2020, 4 pgs.

International Application Serial No. PCT/US2020/045794, Written Opinion mailed Nov. 27, 2020, 5 pgs.

"Chinese Application Serial No. 202080057459.9, Office Action mailed Dec. 8, 2023", w Machine English Translation, 17 pgs.

"Japanese Application Serial No. 2022-508765, Notification of Reasons for Refusal mailed Aug. 20, 2024", w English translation, 9 pgs.

"Chinese Application Serial No. 202080057459.9, Office Action mailed Sep. 13, 2024", w English translation, 9 pgs.

"Japanese Application Serial No. 2022-508765, Response filed Apr. 4, 2025 to Notification of Reasons for Refusal mailed Jan. 7, 2025", W English Claims, 12 pgs.

|  | DOSE | POST DOSE PURGE | RF | PURGE |
|---|---|---|---|---|
| GASES | 5slm Ar + 200 sccm PRECURSOR | 35slm Ar + 10slm O2 | 10slm Ar + 10slm O2 | 10slm Ar + 10slm O2 |
| RF |  |  | ON |  |

FIG. 6 (600)

| ALD STEPS | DOSE | PURGE | RF | PURGE |
|---|---|---|---|---|
| PRESSURE - BKM (Torr) | 2.2 | 2.2 | 2.2 | 2.2 |
| MODIFIED PRESSURE (Torr) | 2.2 | 2.4 | 2.3 | 2.2 |
| FLOWS | 6 | 45 | 20 | 20 |
| MOD FLOWS | 8 | 45 | 20 | 20 |

FIG. 7 (700)

| PARAMETERS TO CONTROL AMPDS PRESSURE | COMMENTS |
|---|---|
| AR PUSH FLOW | IMPACTS THE MAGNITUDE OF PRESSURE, WILL MOVE THE CURVE IN VERTICAL DIRECTION |
| PRECURSOR FLOW | WILL MOVE THE CURVE IN VERTICAL DIRECTION, ONLY DURING THE TIME WHEN AMPOULE IS OPEN |
| AMPOULE INLET AND OUTLET VALVES | THE TIMING OF THE VALVES WILL MOVE THE CURVE IN HORIZONTAL SCALE |
| V/164/166, CHAMBER OUT/LET DIVERT VALVE | THE TIMING OF THE VALVES WILL MOVE THE CURVE IN HORIZONTAL SCALE |

FIG. 10

| CHAMBER PRESSURE | AMPDS PRESSURE | BURST PURGE PRESSURE | DELIVERED POWER |
|---|---|---|---|
| PRESSURE SET POINT IN EACH ALD STEP<br><br>FLOW SETTING IN EACH ALD SET<br>• MAN B GOES TO CHAMBER IN DOSE<br>• MAN C GOES IN NON-DOSE STEPS<br>• MAN A CONTINUOUSLY FLOWS<br>THE FLOWS CAN BE PROPORTIONATELY CHANGED FOR ALL MFCs IN THE PARTICULAR MANIFOLD | AR PUSH GAS<br>AMPOULE TEMPERATURE<br>DOSE TIME<br>RF PURGE TIME | BURST PURGE FLOW<br>POST DOSE PURGE TIME | POWER SET POINT<br>LOAD/TUNE |

FIG. 13

DYNAMIC PROCESS CONTROL IN SEMICONDUCTOR MANUFACTURING

CLAIM OF PRIORITY

This patent application claims the benefit of priority to Kwnar et al. U.S. Provisional Patent Application Ser. No. 62/885,667, entitled "Dynamic Process Control In Semiconductor Manufacturing," filed on Aug. 12, 2019, which is hereby incorporated by reference herein in its entirety.

FIELD

The present disclosure relates generally to dynamic process control in substrate processing and, in some examples, to systems and methods for advanced monitoring and machine learning in atomic layer deposition (ALD) processes. Some examples also relate to dynamic process control and monitoring for chamber matching and gas line charge times.

BACKGROUND

Currently many, if not most, parameters associated with a substrate processing chamber are monitored to operate around component set points. For example, a mass flow controller (MFC) flow or chamber pressure may include a certain error margin. Typically, an upper or lower parameter limit may be set to a value or certain percentage to cater for this error. In ALD processes, for example, valves may be monitored for open and close times with these times being factored in to monitoring parameters, accordingly.

Typically, however, current process monitoring methods are suitable only for detecting relatively broad or gross malfunction of the processing chamber or its components. This gross detection may be acceptable in steady-state or single-step situations, for example in chemical vapor deposition (CVD) or plasma-enhanced chemical vapor deposition (PECVD) processes, but its use or application in a multistep process, such as ALD where chamber conditions can change in milliseconds, is limited.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates generally to dynamic process control in semiconductor substrate manufacturing systems. In some examples, systems and methods are provided for advanced monitoring and machine learning in ALD processes. Some examples also relate to dynamic process control and monitoring for chamber matching and gas line charge times. Some examples are described in the context of semiconductor processing, but may be equally applicable to substrate processing outside such a context, for example for metals and dielectrics such as photomasks.

Some examples monitor successive ALD cycles individually and match every step of an ALD cycle using curve fitting or a defined error margin. Every ALD cycle is rendered repeatable in some examples, and a time reference may be defined to monitor a repeatability of different variables. In some examples, a comparison may be made of successive ALD cycles for different measured variables. Example variables may include chamber pressure, precursor delivery pressure (or precursor manifold pressure), radio frequency (RF) energy reflected, forward power, and burst purge pressure. Other monitored variables and parameters are possible.

Some examples provide a tool warning or error message based on a deviation from a monitored value. Some examples include algorithms and software to enable these goals.

In an example embodiment, a system for monitoring processing cycles in an atomic layer deposition (ALD) semiconductor manufacturing process is provided. An example system comprises a processing chamber for the ALD manufacturing process; and one or more controllers configured to perform process monitoring operations, the operations comprising: defining a datum time reference of an ALD cycle based on a repeated action in the manufacturing process; accessing a golden curve including a series of parameter values for a series of data points in cyclical time increments based on a time reference; accessing a variability or tolerance margin for each data point in the golden curve; collecting parameter data based on the cyclical time increments for a cycle in the ALD manufacturing process; dynamically monitoring whether a parameter value in the parameter data falls within a variability or tolerance margin at a data point; based on determining that a parameter value falls outside the variability or tolerance margin, adjusting the manufacturing process so that the parameter value in a subsequent cycle matches the associated parameter value in the golden curve.

In some examples, the repeated action, forming the basis of the datum time reference, includes an opening or closing of a specified valve supplying the processing chamber. In some examples, the parameter data is collected at regular intervals based on a collection frequency, the collection frequency being in the range 0-1 Hz, or 1-10 Hz, or 10-100 Hz, or 100-1000 Hz.

In some examples, the regular intervals are based on trigger points in the ALD manufacturing process, each trigger point defining or based on a time point in a step within the ALD manufacturing process.

In some examples, the operations further comprise comparing the parameter data collected at the trigger points with a corresponding set of parameter data in the golden curve. In some examples, the parameter data includes parameter values associated with one or more of a precursor manifold pressure, a purge pressure, a conversion manifold pressure, a chamber pressure, a gas flow, an RF reflected power, and an RF forward power.

In a further example, an example system comprises a processing chamber for the manufacturing process; and one or more controllers configured to perform process monitoring operations, the operations comprising: identifying a parameter of the manufacturing process; generating a first curve of parameter values including a first parameter value based on a first cycle of the manufacturing process; based on the generated curve for the first cycle, identifying a second value of the parameter for a second cycle of the manufacturing process; and adjusting the manufacturing process to match the first parameter value with the second parameter value.

In some examples, the operations further comprise: generating a second curve including a plurality of parameter values derived from the second cycle of the manufacturing process; and curve fitting the second curve of parameter values with the first curve of parameter values.

In some examples, the curve fitting operation includes: fitting a series of curves of parameter values, based on or derived from third and subsequent cycles of the manufacturing process, with the first or second curve to generate a golden curve defining a set of golden parameter values for the manufacturing process. In some examples, each cycle of the manufacturing process includes a plurality of steps in an ALD process; and the operations further comprise: matching a parameter value in each step of the ALD process with a parameter value in the set of golden parameter values.

In some examples, the golden curve includes golden parameter values for each step in the ALD process. In some examples, the identified parameter is associated with a control variable of the manufacturing process; and wherein the operations further comprise: using the first and second parameters values, directly or indirectly, to identify a matching value of the control variable in the second cycle with a value of the control variable in the first cycle; and adjusting the manufacturing process to match the first parameter value with the second parameter value.

In a further example, a self-learning system for monitoring processing steps in a semiconductor manufacturing cycle is provided. An example system comprises a processing chamber for accommodating a semiconductor manufacturing process including a series of repeated semiconductor manufacturing cycles, each cycle including a plurality of processing steps; and one or more controllers associated with the processing chamber configured to perform process monitoring operations, the operations comprising: generating a set of golden reference parameter values for each step in in the series of repeated cycles based on parameter data collected from the processing chamber; generating a machine-learned model based on the set of golden reference values; and using the machine-learned model to match a parameter value in a second cycle in the series of repeated cycles with a corresponding parameter value in a first cycle in the series of repeated cycles.

In some examples, the semiconductor manufacturing process is an ALD process; and the steps of each cycle in the series of repeated cycles include sequential steps comprising dose, purge, conversion, and purge steps.

In some examples, the operations further comprise: generating a golden curve including parameter value data for each sequential step; and using the golden curve as training data for the machine-learned model.

In some examples, the operations further comprise: based on the machine-learned model, repeating and matching each cycle in the series of repeated cycles by matching parameter values in each sequential step of the second cycle with corresponding parameter values of each sequential step of the first cycle.

In some examples, the parameters include one of more of a precursor manifold pressure, a purge pressure, a chamber pressure, a gas flow, a chamber temperature, an RF reflected power, and an RF forward power.

In some examples, the operations further comprise: collecting performance data from the processing chamber; identifying a drift in the performance data and generating performance drift data; and incorporating the drift data into training data for the machine-learned model.

In a further example, a system for monitoring processing cycles in a semiconductor manufacturing process is provided. Here, an example system comprises a processing chamber for the manufacturing process; and one or more controllers configured to perform process monitoring operations, the operations comprising: identifying a parameter of the manufacturing process; and generating a first curve of parameter values including a first parameter value based on a first cycle of the manufacturing process, the parameter values including a gas line charge time for a line supplying the processing chamber.

In some examples, the operations further comprise: calculating the gas line charge time based on a pressure ramp up time between an opening of a valve in the line supplying the processing chamber and establishment of constant pressure increase thereafter. In some examples, the operations further comprise: based on the generated curve for the first cycle, identifying a second value of the parameter for a second cycle of the manufacturing process; generating a second curve including a plurality of parameter values derived from the second cycle of the manufacturing process; and curve fitting the second curve of parameter values with the first curve of parameter values.

In some examples, the curve fitting operation includes: fitting a series of curves of parameter values, based on or derived from third and subsequent cycles of the manufacturing process, with the first or second curve to generate a golden curve defining a set of golden parameter values for the manufacturing process. In some examples, each cycle of the manufacturing process includes a plurality of steps in an ALD process; and the operations further comprise: matching a parameter value in each step of the ALD process with a parameter value in the set of golden parameter values.

In some examples, the golden curve includes golden parameter values for each step in the ALD process.

In some examples, the identified parameter is associated with a control variable of the manufacturing process; and the operations further comprise: using the first and second parameters values, directly or indirectly, to identify a matching value of the control variable in the second cycle with a value of the control variable in the first cycle and adjusting the manufacturing process to match the first parameter value with the second parameter value.

BRIEF DESCRIPTION OF THE DRAWINGS

Some embodiments are illustrated by way of example and not limitation in the views of the accompanying drawing:

FIG. 6 includes a table of example steps and parameters in an ALD cycle, according to example embodiments.

FIG. 7 includes a table of example golden and modified values for process control in an ALD cycle, according to example embodiments.

FIG. 10 depicts a table including a set of parameters for adjusting precursor manifold pressure in an ALD cycle, according to example embodiments.

FIG. 13 depicts a table including examples of parameters that can be modified to match for different control variables, according to example embodiments.

DESCRIPTION

Figure 1:
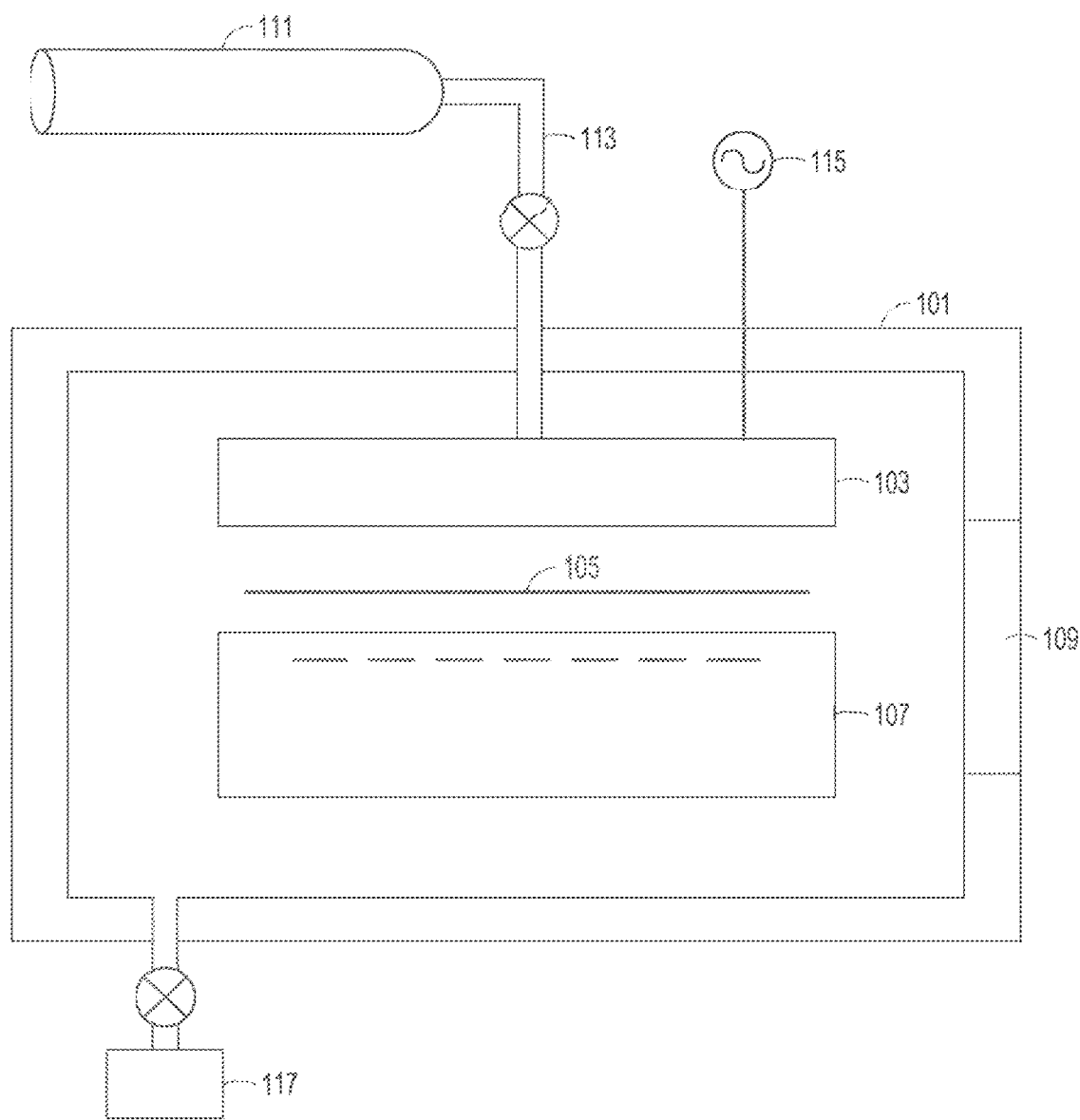
FIG. 1 is a schematic diagram of a reaction chamber within which some examples of the methods of the present disclosure may be employed, according to some examples.

The description that follows includes systems, methods, techniques, instruction sequences, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2019-2020, All Rights Reserved.

With reference now to FIG. 1, an example of a plasma-based processing chamber is shown. The present subject matter may be used in a variety of semi-conductor manufacturing and substrate processing operations, but in the illustrated example, the plasma-based processing chamber is described in the context of plasma-enhanced or radical-enhanced CVD or ALD operations. The skilled artisan will also recognize that other types of ALD processing techniques are known (e.g., thermal-based ALD operations) and may incorporate a non-plasma-based processing chamber, An ALD tool is a specialized type of CVD processing system in which ALD reactions occur between two or more chemical species. The two or more chemical species are referred to as precursor gases and are used to form a thin film deposition of a material on a substrate, such as a silicon substrate as used in the semiconductor industry. The precursor gases are sequentially introduced into an ALD processing chamber and react with a surface of the substrate to form a deposition layer. Generally, the substrate repeatedly interacts with the precursors to deposit slowly an increasingly thick layer of one or more material films on the substrate. In certain applications, multiple precursor gases may be used to form various types of film or films during a substrate manufacturing process.

FIG. 1 is shown to include a plasma-based processing chamber 101 in which a showerhead 103 (which may be a showerhead electrode) and a substrate-support assembly 107 are disposed. The substrate-support assembly 107 may include a pedestal such as is described in more detail below. Typically, the substrate-support assembly 107 seeks to provide a substantially-isothermal surface and may serve as both a heating element and a heat sink for a substrate 105. The substrate-support assembly 107 may comprise an electrostatic chuck (ESC) in Which heating elements are included to aid in processing the substrate 105, as described above. The substrate 105 may include a substrate comprising elemental semiconductors (e.g., silicon or germanium), a substrate comprising compound elements (e.g., gallium arsenide (GaAs) or gallium nitride (GaN)), or variety of other substrate types (including conductive, semi-conductive, and non-conductive substrates).

In operation, the substrate 105 is loaded through a loading port 109 onto the substrate-support assembly 107. A gas line 113 can supply one or more process gases (e.g., precursor gases) to the showerhead 103. In turn, the showerhead 103 delivers the one or more process gases into the plasma-based processing chamber 101. A gas source 111 (e.g., one or more precursor gas ampules) to supply the one or more process gases is coupled to the gas line 113. In some examples, an RF power source 115 is coupled to the showerhead 103. In other examples, a power source is coupled to the substrate-support assembly 107 or ESC.

Prior to entry into the showerhead 103 and downstream of the gas line 113, a point-of-use (POU) and manifold combination (not shown) controls entry of the one or more process gases into the plasma-based processing chamber 101. In the case of a plasma-based processing chamber 101 used to deposit thin films in a plasma-enhanced ALD (PEALD) operation, precursor gases may be mixed in the showerhead 103.

In operation, the plasma-based processing chamber 101 is evacuated by a vacuum pump 117. RF power is capacitively coupled between the showerhead 103 and a lower electrode (not shown explicitly) contained within or on the substrate-support assembly 107. The substrate-support assembly 107 is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil designed to block or partially block a particular RF frequency can be designed as needed. Therefore, particular frequencies discussed herein are provided merely for ease in understanding. The RF power is used to energize the one or more process gases into a plasma in the space between the substrate 105 and the showerhead 103. The plasma can assist in depositing various layers (not shown) on the substrate 105. In other applications, the plasma can be used to etch device features into the various layers on the substrate 105. RF power is coupled through at least the substrate-support assembly 107. The substrate-support assembly 107 may have heaters (not shown in FIG. 1) incorporated therein. The detailed design of the plasma-based processing chamber 101 may vary.

In some examples, within a given overall cycle, ALD can be considered a multi-step process (primarily four steps, for example) including dose, purge, conversion, and purge steps that occur within a processing chamber. Other cycles and steps are possible. Unlike certain PECVD processes in which parameters such as gas flow, chamber pressure, and RF values remain constant during an entire deposition process (cycle), in ALD these process parameters (and others) can vary with each step within an overall cycle or even in successive cycles.

Unmonitored changes in parameters during different steps can mask fluctuations in several key control variables. For example, chamber pressure is conventionally sought to be maintained at a constant value or set pressure. Fluctuations in gas flows to the chamber during different steps in a multi-step process are conventionally controlled by a throttle valve which moves continuously in seeking to maintain a set pressure. The changing gas flow and moving throttle valve can, however, suffer from inherent feedback delay, and this can often lead to poor control during ALD processes, for example.

Similarly, a precursor manifold pressure in a gas line supplying a precursor gas, for example argon (Ar), almost invariably fluctuates during processing due to surge or retarding changes in the gas flow when the precursor gas is admitted to the chamber or directed to a bypass. In other words, a given gas line pressure may change within a range depending on whether the gas is flowing to the chamber (for example, creating a burst purge pressure) or to a divert (for example, creating a restricted flow pressure). These fluctuations are evident and undesired in many, if not all, ALD cycles. Parameter deviations from set values may indicate a chamber processing issue and can impact substrate and film properties.

Figure 2A:
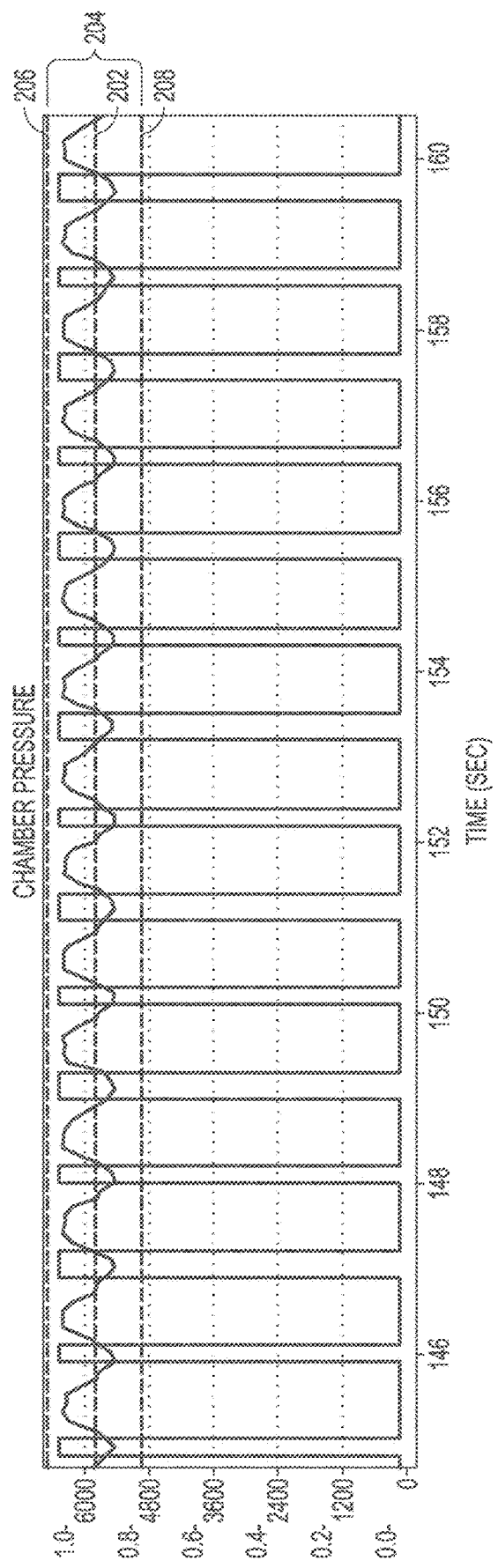
FIGS. 2A-2C display aspects of conventional methods for monitoring chamber parameters, according to example embodiments.
Figure 2B:
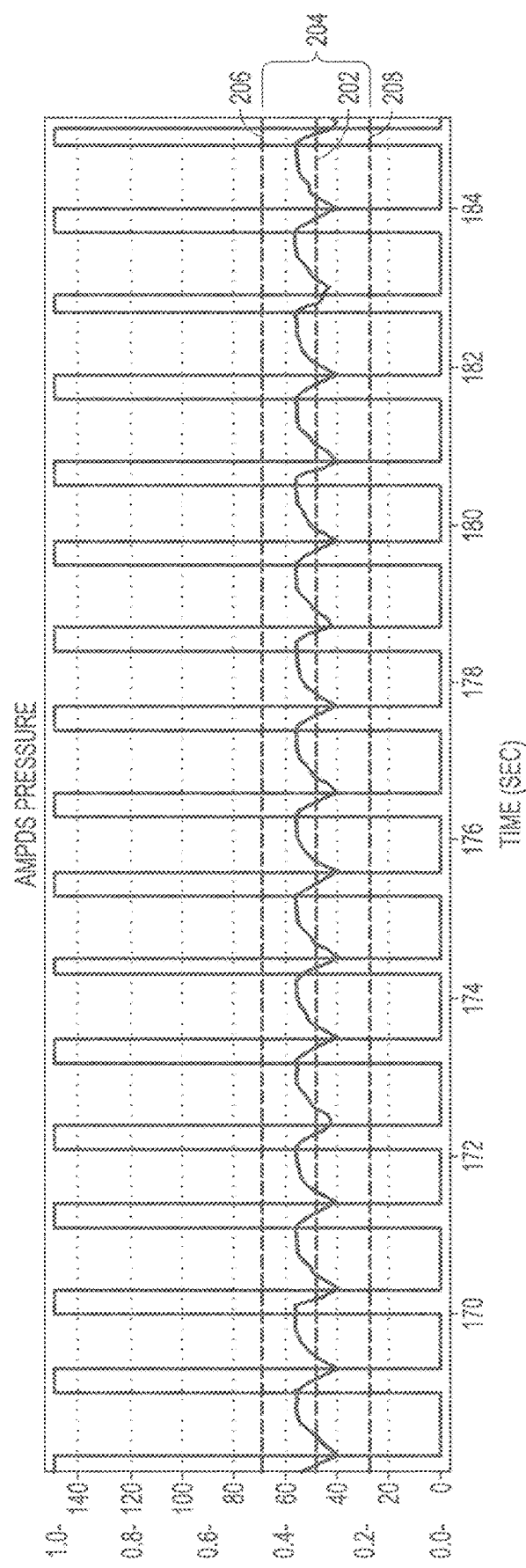
Figure 2C:
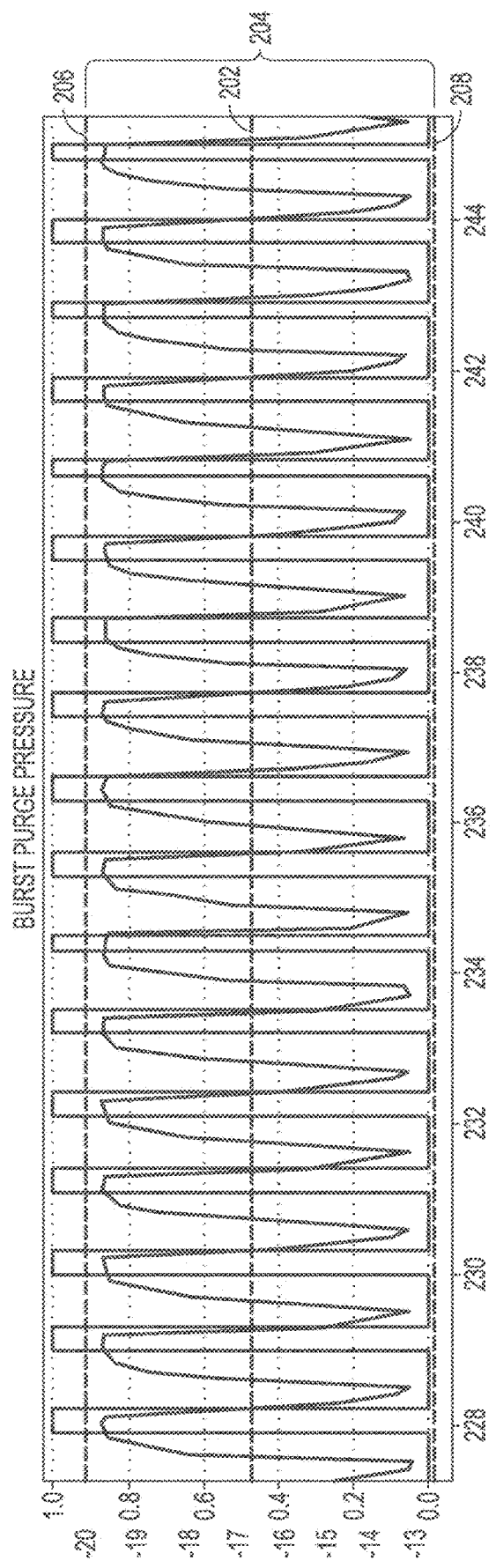

With reference to FIGS. 2A-2C, conventional methods to monitor chamber parameters may include (merely for example) monitoring a chamber pressure (FIG. 2A), a precursor manifold pressure (FIG. 2B), and a purge pressure (FIG. 2C) around a set point 202 and an error band 204 set between upper and lower limits 206 and 208. The error band 204 is often relatively large and indeed large enough that it cannot detect smaller, potentially significant, fluctuations that occur during an ALD cycle. As such, conventional efforts based on set points and error bands do not accurately or truly monitor more detailed aspects or chamber conditions during an ALD cycle. More accurate, controllable, and increasingly specific chamber control is sought by present-day substrate manufacturers to enable the creation of high-aspect nanometer-sized formations and semiconductor devices on substrates.

Figure 3:
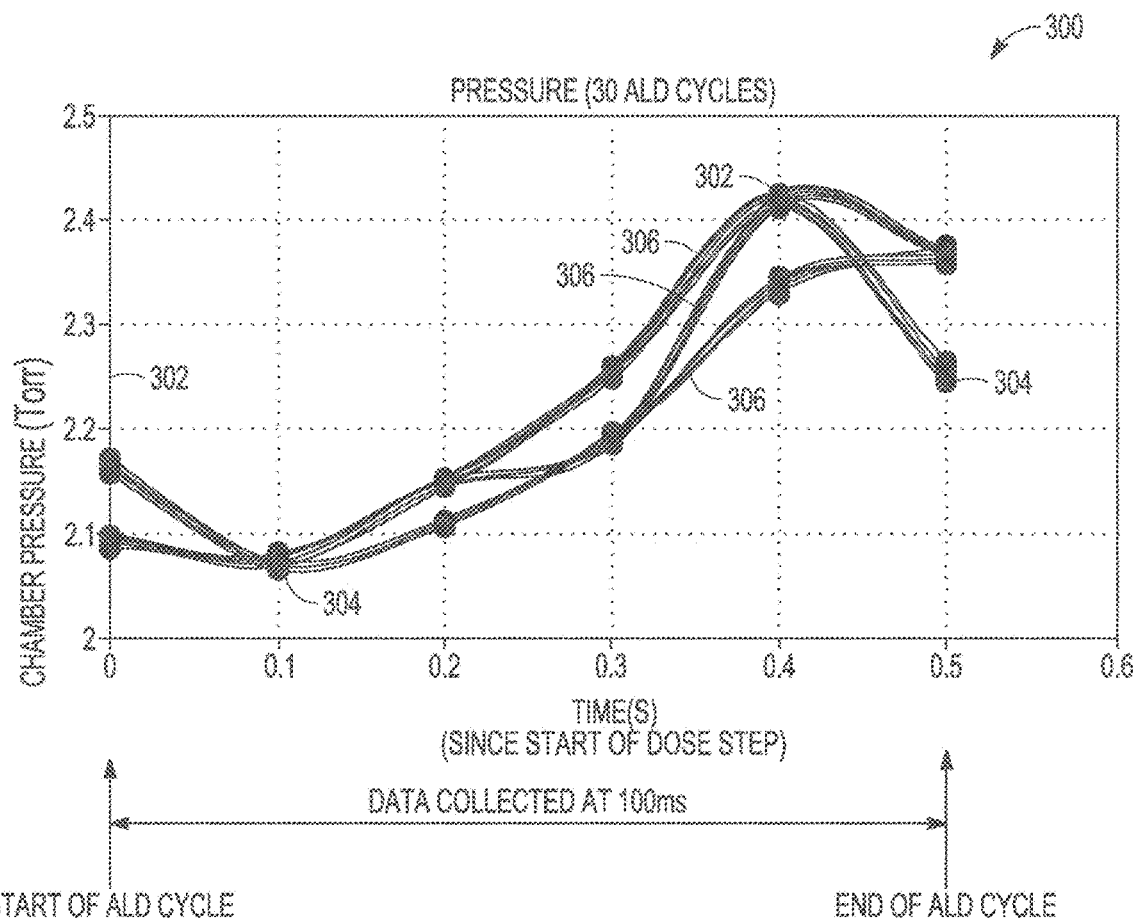
FIG. 3 depicts a graph 300 for an example curve fitting of thirty (30) ALD cycles, according to an example embodiment.

In this regard, reference is now made to FIG. 3 hereof. In some examples, successive dose, purge, conversion, and purge (again) steps within an overall deposition or etch cycle are monitored and matched using curve fitting. Some examples include a defined error margin configured for each specific step, as opposed to a general error band defined for a full cycle of the type discussed above. In some examples, each step (for example, each of the four steps mentioned above) in an ALD cycle is rendered repeatable based on the curve fitting or defined step-specific tolerance margins. A time reference can be defined to monitor repeatability of different variables.

In some examples, a frame of reference for process parameter monitoring is established for subsequent steps or cycles by an earlier or initial step or cycle, as opposed for example to being established by a conventional set point and error band. In fact, some examples are agnostic (i.e., ignore) regarding a conventional set point or error band and operate on the basis of repeating an earlier cycle or step in a given substrate manufacturing process. For example, parameters in an ALD cycle may be adjusted by trial and experiment to create a desired formation on a substrate. Without necessarily knowing or identifying what the absolute values of those successful parameters are, examples of the present disclosure allow a processing chamber simply to be configured to repeat the successful cycles based on data derived from a curve fitting or as defined by the step-specific tolerance margins.

FIG. 3 depicts a graph 300 for an example curve fitting of thirty (30) ALD cycles, Chamber pressure (y-axis) was monitored in time increments of 100 milliseconds (ms) for the duration of each ALD cycle, Elapsed time between a start and end for each ALD cycle was in a range of approximately a second or less with chamber pressure data collected at each time increment within that duration, as shown. A set of curves 306 representing the chamber pressure fluctuate between data peaks 302 and valleys 304 during the course of successive steps (for example, dose, purge, conversion, and purge) within each ALD cycle. In the illustrated example, the start of each ALD cycle commences with a dosing step.

Figure 4:
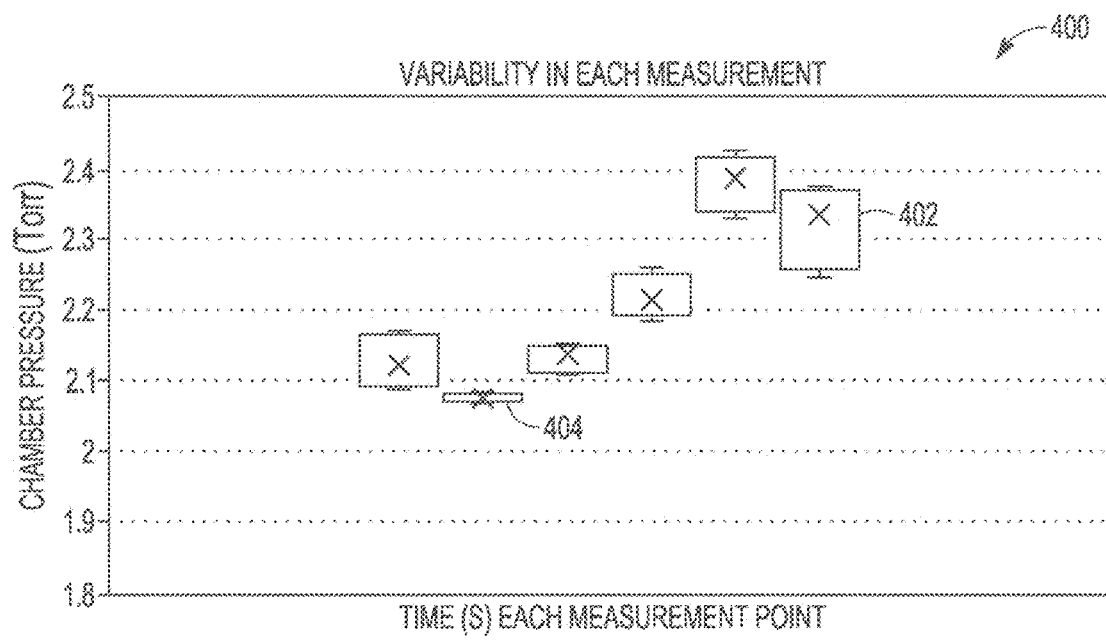
FIG. 4 depicts a graph including tolerance margins, according to example embodiments.

A curve fitting operation is performed for each curve 306 in the set of curves so that successive or subsequent ALD cycles repeat an earlier one. Each step within an ALD cycle may also repeat an earlier one in this regard, a step-specific tolerance margin may be established for one (or more) time increments associated with that step. A tolerance margin may be based on observed or set variability data of the type depicted in the graph 400 of FIG. 4. Here, for each time increment, a variability (or tolerance margin) in the chamber pressure may be observed. A relatively wide (or slack) tolerance margin 402 may correspond to a relatively wide set of chamber pressures represented by the curve set at the 0.4 time increment of FIG. 3 for example. Conversely, a relatively narrow (or strict) tolerance margin 404 may correspond to a relatively narrow (or even coincident) set of chamber pressures represented by the curve set at the 0.1 time increment of FIG. 3, for example. A variability or tolerance margin for each time increment during a step or ALD cycle may be defined, One or more curves 306 within a curve set may also be defined independently or based on the tolerance margins. A set of one or more curves 306 and/or step-specific tolerance margins can be established and used for step and cycle monitoring and repeatability during ALD cycles in a substrate processing operation, for example.

Figure 5:
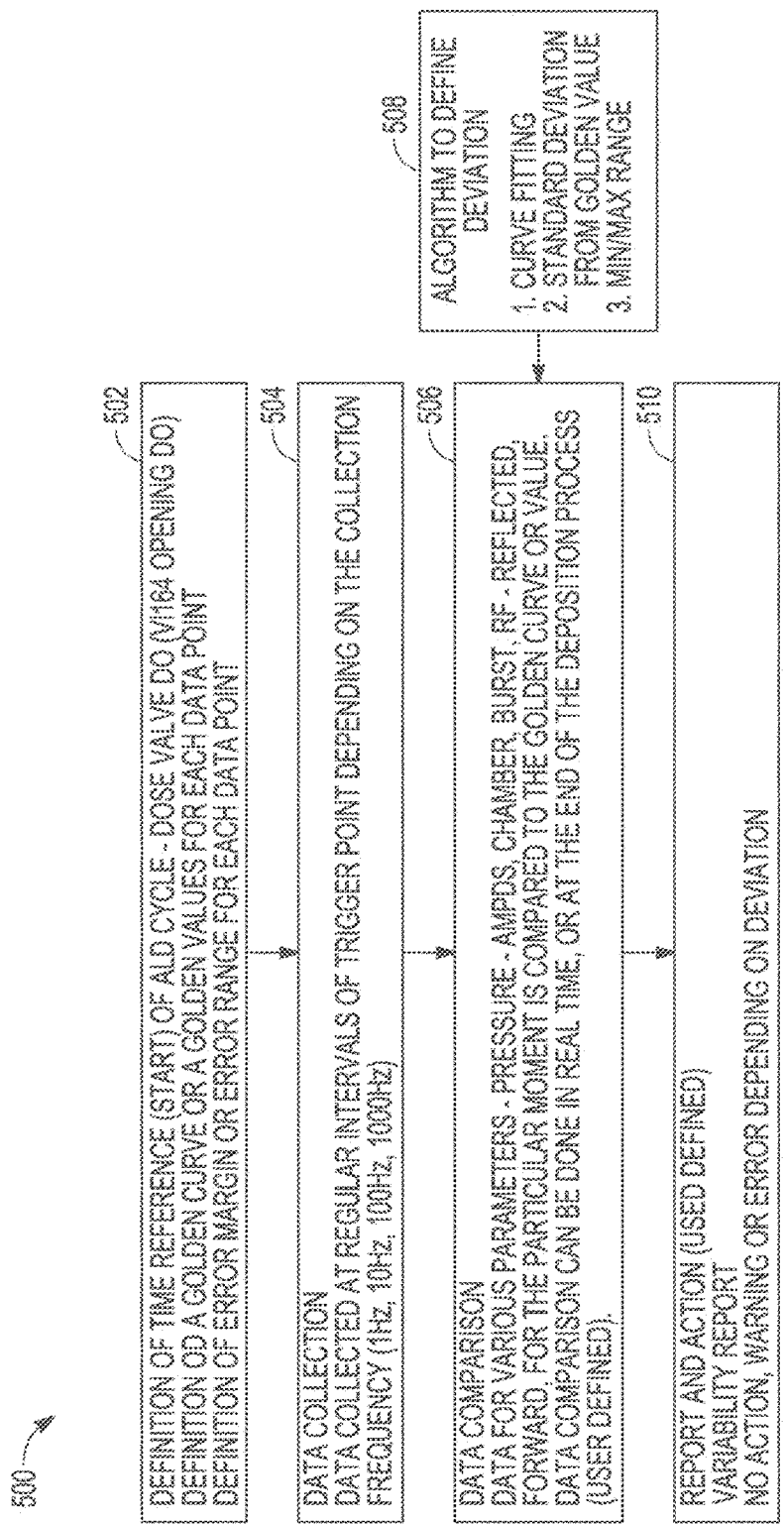
FIG. 5 depicts a flow chart of example operations in a method, according to example embodiments.

FIG. 5 depicts a flow chart of example operations of a monitoring method 500 for steps or cycles in an ALD process, for example. In some examples, operation 502, includes defining a time reference (start) of an ALD cycle (for example, an opening of a certain dose valve). In some examples, operation 502 may also include defining a "golden curve" or golden values for a series of data points (for example, time increments). In some examples, operation 502 further includes defining a variability or tolerance margin for each data point (time increment).

In some examples, operation 504 includes collecting parameter data. In some examples, parameter data is collected at regular intervals (for example, at so-called trigger points) based on a collection frequency (for example, at 1 Hz, 10 Hz, 100 Hz, or 1000 Hz).

In some examples, operation 506 may include data comparison, for example comparing data for various parameters such as a chamber pressure, a precursor manifold pressure, a purge pressure, an RF reflected power, and an RF forward power. Parameter values for particular time increments (trigger points) are compared to the golden curve or values. In some examples, data comparison may be performed in real time, at the end of a given cycle or step, or at the conclusion of a given substrate manufacturing process. It may be user defined or based on process needs or optimization.

In some examples, operation 508 includes generating an algorithm enabling repeatability of steps and cycles. An example algorithm may include (or be based on) one or more of a curve fitting, a standard deviation from a golden value, or a minimum or maximum range in a variability or tolerance margin. Other algorithm factors are possible.

In some examples, operation 510 includes reporting (for example, generating an output of a curve fitting, or generating a variability report). In some examples, operation 510 may include identifying and/or taking a corrective action to adjust a process parameter based on the variability report or to bring the process parameter within a set of fitted curves or a tolerance margin, for example. Some examples may include taking no action if a process parameter falls within a set of fitted curves or a tolerance margin, for example. A tool or processing chamber warning may be generated (or not generated) accordingly.

Process parameter fluctuations can also make process control and monitoring difficult in other areas. For example, substrate to substrate variation (or lot to lot variation) can be caused by an accumulation of chamber heat during substrate processing. Tool to tool variation can be caused by pump efficiency differences. Conventionally, primary efforts to control variation have focused on monitoring individual device performance. Example devices and their associated parameters may include an MFC flow in which a device error limit is set at 1% of flow. The MFC flow is monitored to operate within that limit during substrate processing. Further devices and parameters may include valve timing (for example, an ALD valve timing monitored to operate for an open time of 50 ms and a close time of 70 ms). In another example, a valve may be set to toggle between open and close positions at 25 ms. In other examples, a pedestal temperature can be controlled using a thermocouple monitoring for deviations in a set range. RF power control may include monitoring of forward and reflected power. These devices typically suffer from inherent performance or response limitations that can lead to poor chamber control and random or fluctuating chamber conditions. Insufficiently tight monitoring limits and a multiplicity of process factors and device limitations can contribute to this undesired effect.

Moreover, with reference to FIG. 6, unlike most PECVD processes in which parameters such as gas flows, pressure, and RF power generally remain constant during an entire deposition process, some parameters in each cycle change continuously during ALD processes (cycles). Table 600 in FIG. 6 illustrates example steps and associated parameters in an ALD cycle. These steps may include dose, post dose purge, RF power application, and purge, as shown.

Some examples herein seek to address such challenges and include a matching of measured parameters as opposed to a monitoring of device parameters. Some examples are thus configured to enable matching device and/or chamber performance for a given set of process steps or cycles and across a set of process chambers in a processing tool, for example. For example, a pressure fluctuation or pressure generated during each ALD step can be matched cycle by cycle or across tools and chambers by adjusting one or more process parameters occurring in the individual steps of a cycle. For example, a given pressure setpoint in an individual step (or cycle) in a substrate manufacturing process may be matched (or repeated) across steps or cycles using dynamic and real-time adjustment of gas flow.

Similarly, varying levels of precursor manifold pressure can impact deposition rates (depR) and may be a key variable in chamber matching, in some examples. Precursor manifold pressure can, in turn, be impacted by one or more example factors, such as a precursor gas (e.g. Ar) push flow, a precursor flow (or ampoule temperature), a pumping efficiency through a divert, and a chamber outlet or divert timing. As discussed above, current technology controls and monitors device set points, for example MFC flows, valve opening and closing times, power to RF generators and so forth, and tries to control chamber parameters to set points. Substrate to substrate, lot to lot, and tool to tool variability is controlled by using the device parameters and monitoring the same. Matching is assumed to result from the control of the device parameters. However, actual conditions within a processing chamber or a gas line are not controlled or matched within the time limits imposed by ALD steps and cycles.

Some examples include dynamic process control and monitoring for chamber matching. Examples may include a matching of measured parameters instead of matching a device parameter to achieve a matching chamber performance. In some examples, a "golden curve" or golden values may represent a set of desired parameter values for making a given or desired substrate formation in a chamber, for example. A chamber may operate with control variables set at "golden" conditions or values. In some examples, a "golden curve" may be based on parameter data derived from one step or cycle and thereafter used as a datum or reference point to repeat that step or cycle, or to match parameter values or control variables across chambers, substrates, and tools, for example.

An example set of golden values for associated steps in an ALD cycle appears in the Table 700 in FIG. 7 hereto. The pressure and gas flow rows each include two values: a "golden" value (simply labeled pressure or flow), and a "modified" pressure or flow, respectively. In some examples, during operation, the pressure in each step is modified so that a monitored pressure curve matches the golden values of a golden chamber. Similarly, gas flows in each step can be modified to match golden flow values or golden pressure values. An adjustment in one parameter may cause a direct change in that parameter or cause an indirect change in another parameter associated with the first parameter (for example, a chamber gas flow change influencing an associated change in a chamber gas flow pressure).

In some examples, a pressure fluctuation or pressure that is present in a first step in an ALD cycle is matched in a subsequent step (or cycle) by adjusting a pressure setpoint. So, in some examples, a process is controlled to match an earlier process parameter as a yardstick of sorts, rather than by adjusting to a given device parameter. In some examples, a matching pressure adjustment is performed in individual steps or by cycle. In some examples, the pressure matching is performed directly or indirectly by matching an earlier gas flow, for example.

Figure 8:
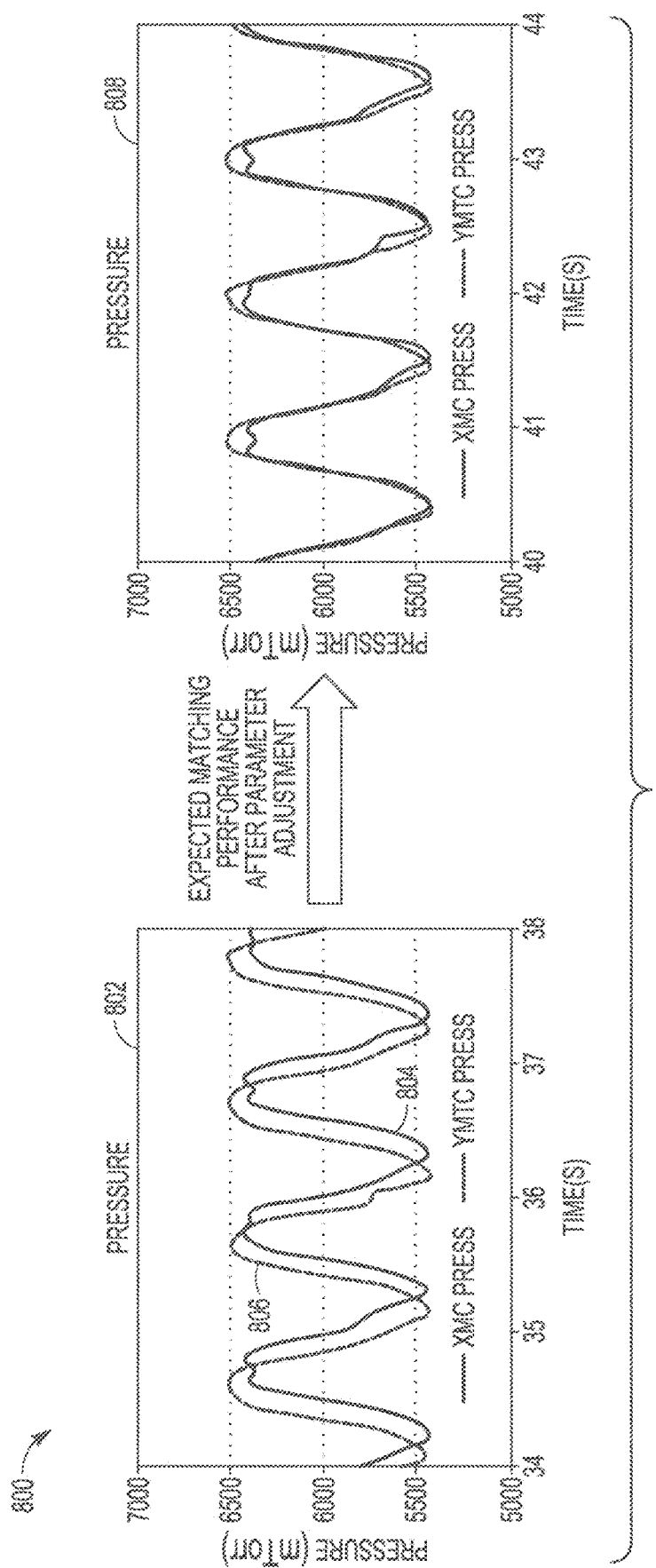
FIG. 8 depicts example matching operations in a matching method, according to example embodiments.

Example matching operations in a matching method 800 are illustrated in FIG. 8. In the graph 802, it will be seen that Tool A pressure curve 804 in a first step or cycle does not match a Tool B pressure curve 806 in a second step or cycle.

Their respective value curves do not match and are offset with respect to one another. In the illustrated example, the Tool B pressure values in curve 806 may be said to lag behind the Tool A pressure values in curve 804. In some examples, adjustments are made to a chamber parameter, for example a gas flow or pressure parameter, so that the two curves 804 and 806 substantially match as shown in the graph 808. The accurately matched steps or cycles help to ensure a repeatability of chamber conditions and a consistency in substrate manufacturing with consequent improved accuracy in the creation of substrate formations and semiconductor devices.

Figure 9:
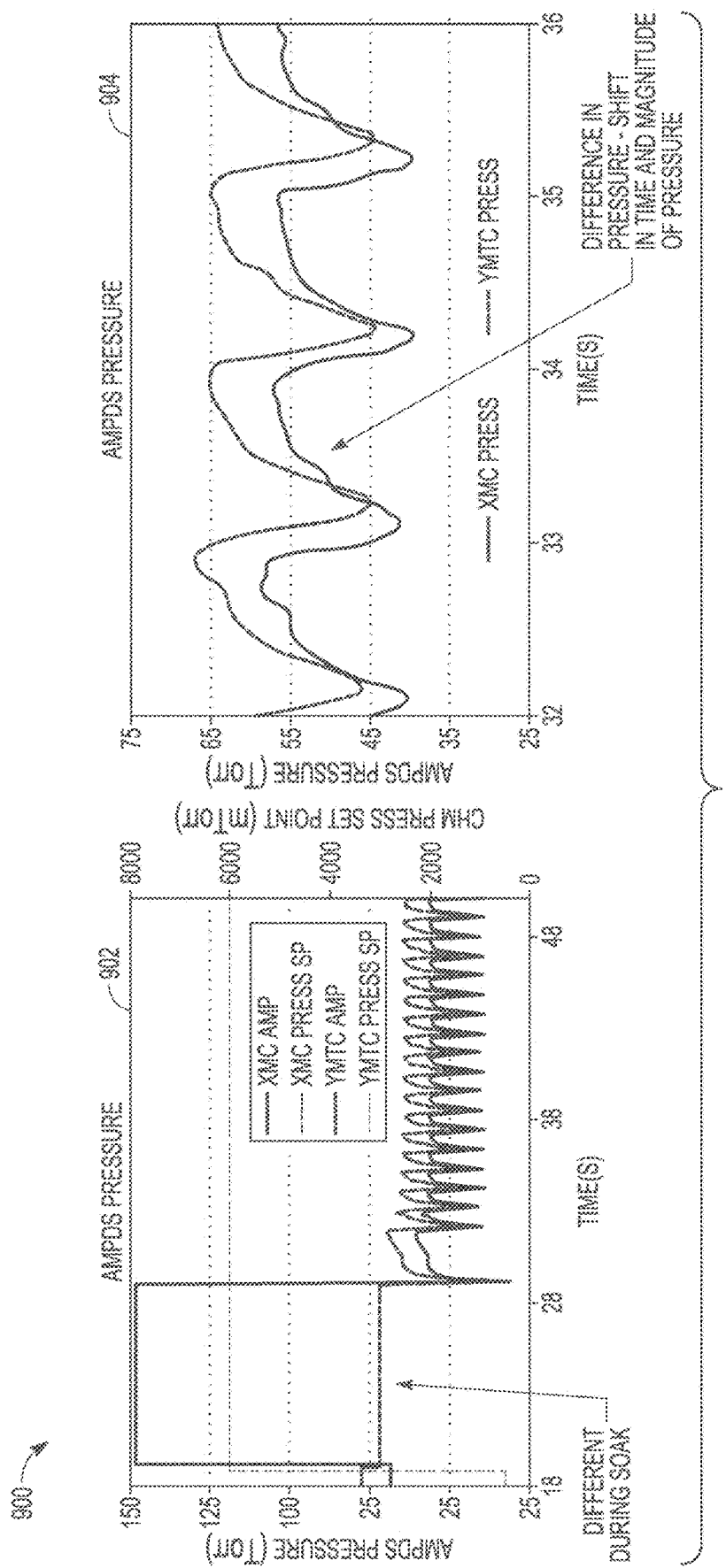
FIG. 9 depicts example chamber to chamber differences, according to example embodiments.

In other examples, a precursor manifold pressure curve for two different chambers during an ALD cycle may not match even though all the relevant devices on the tool are functioning within specification. A chamber to chamber variability may result from pumping efficiency differences, valve timing differences in precursor manifold pressure and chamber valves, gas line temperatures and so forth. Example chamber to chamber differences are depicted pictorially in FIG. 9. For example, in graph 900, a difference in chamber to pressure may be observed in a period 902. In graph 904, a difference in respective (chamber to chamber) pressure is discernible. The illustrated pressure curves 906 and 908 are offset (not matched) with respect to one another in relation to time and magnitude of pressure.

Some examples address the problem of chamber to chamber matching. In this regard, a set of parameters for adjusting precursor manifold pressure in an ALD cycle appears in the Table 1000 in FIG. 10 hereto. The example parameters include a precursor gas flow (for example, argon Ar), a precursor flow, ampoule inlet and outlet valve timing, and chamber inlet and outlet valve tuning. The example parameters may have golden values or golden curves associated with each of them. Other parameters are possible.

Controlling effects or impacts on precursor manifold pressure can be imparted by making certain adjustments in some parameters, for example as indicted in the comments section of Table 1000. For example, an argon push flow can impact a magnitude of precursor manifold pressure and can move a pressure curve in a vertical direction. In other words, if an precursor manifold pressure curve established in a second or subsequent step (or cycle) is to be matched to a corresponding curve established in (or generated by) an earlier step or cycle, and appears "lower" than the earlier curve in a matching graph (for example, a graph 802), then the curve of pressures in subsequent cycles (third and fourth cycles, etc.) can be corrected to move upwardly by adjusting an argon precursor push flow, accordingly. Conditions in a processing chamber can thus be configured to remain essentially constant by monitoring parameter values derived from an earlier step or cycle, as opposed to being based on an inflexible set point or error band.

Figure 11:
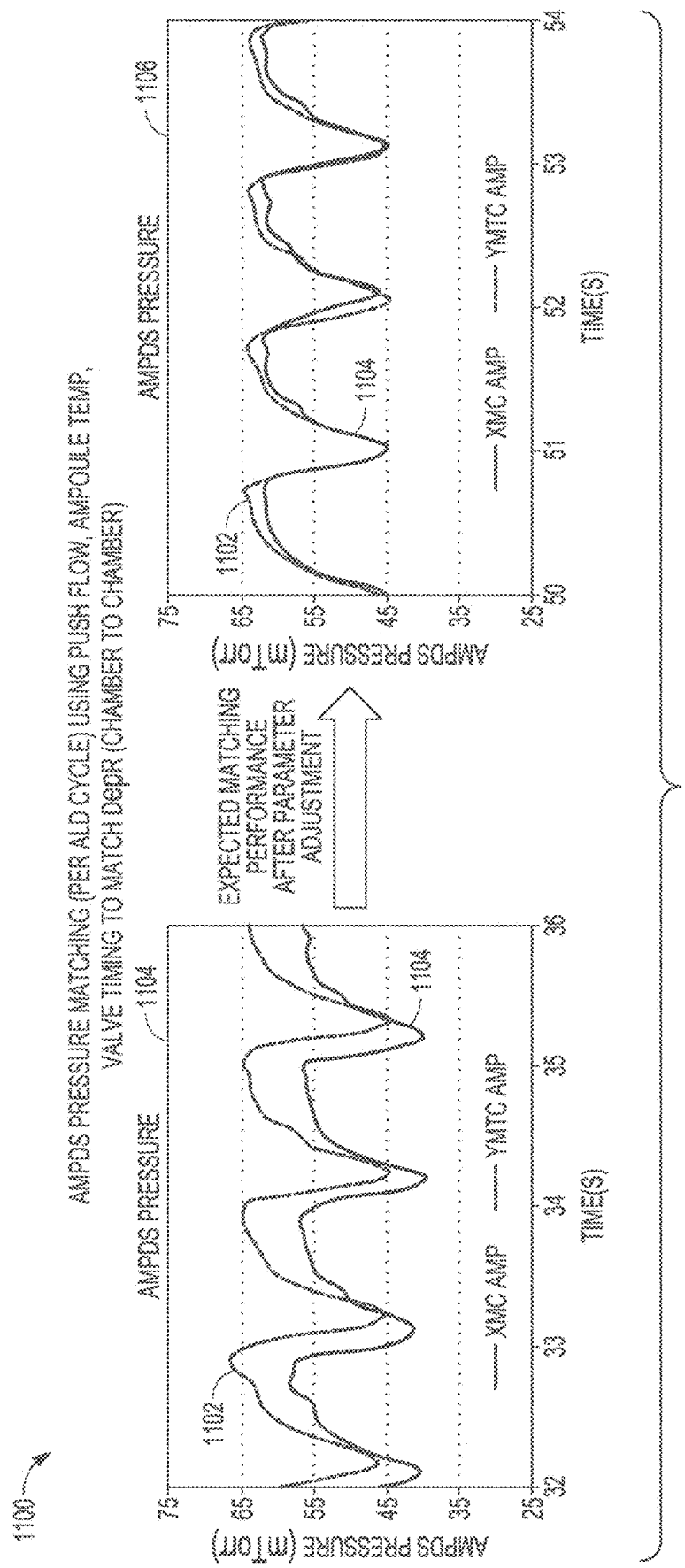
FIG. 11 depicts example matching operations in a matching method, according to example embodiments.

Example operations in a matching method 1100 are illustrated in FIG. 11. Here, in order to establish a matching precursor manifold pressure 1102 and 1104 in each step or cycle of an ALD process, changes in parameters such as a push flow (per ALD cycle), an ampoule temperature, and a valve timing were utilized. In turn, the matched precursor manifold pressure can enable a match in a chamber to chamber deposition rate, as being dependent thereon.

Figure 12:
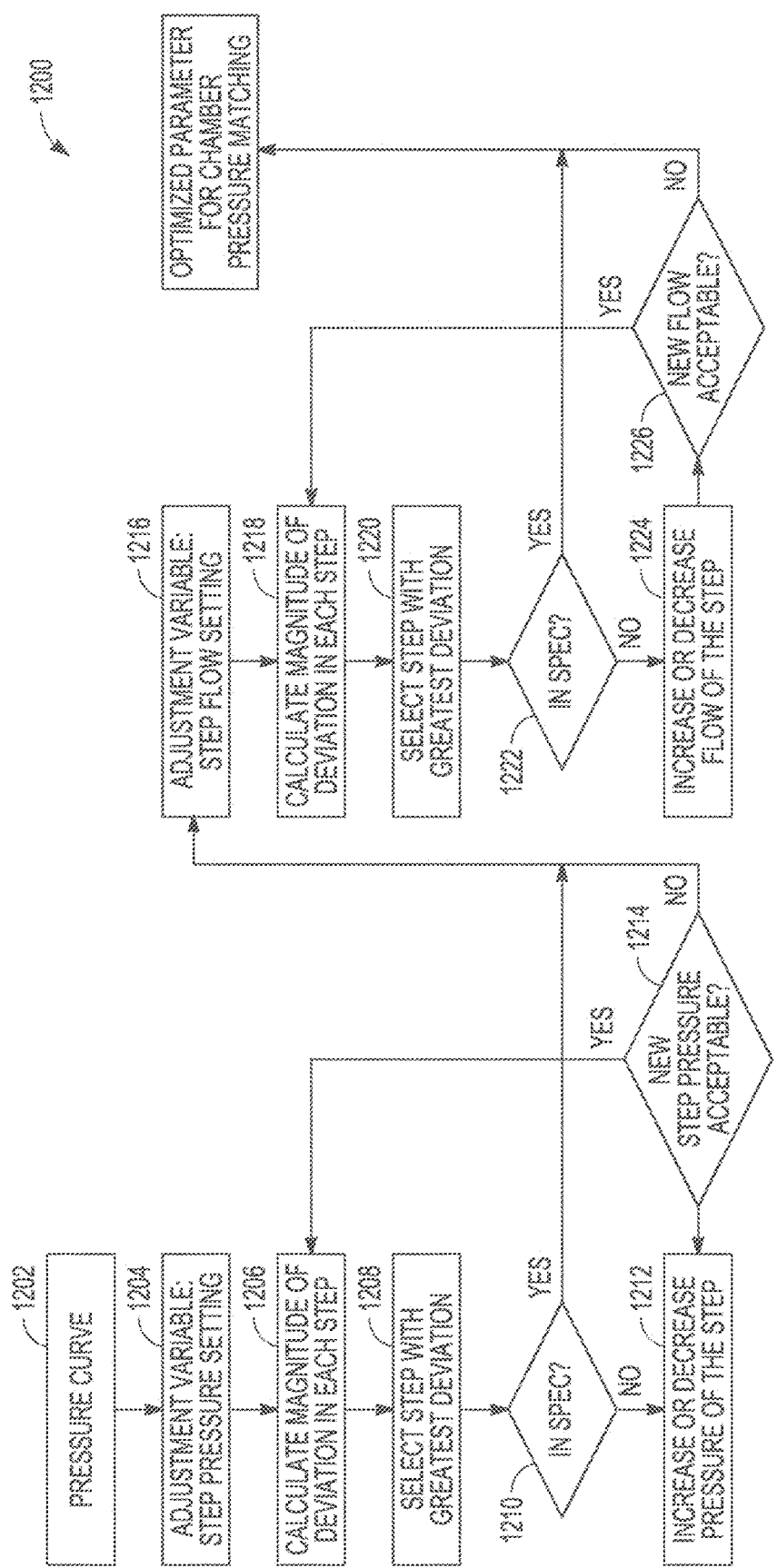
FIG. 12 depicts example control operations in a method for dynamic process control in a chamber, according to example embodiments.

Example operations in a method for dynamic process control may include selecting a control variable to match (for example, pressure), determining a parameter to change to modify the control variable, determining control increments for the parameter, and calculating a deviation of the control variable from a golden curve. With reference to FIG. 12, example control operations in a method 1200 for dynamic process control in a chamber may include, at operation 1202, identifying a control variable (for example, pressure) and establishing a golden curve or values for it; at operation 1204, identifying a first adjustment parameter that can affect a value of the identified control variable; at operation 1206, determining a magnitude or step-wise increment in the identified parameter for the control variable; at operation 1208, selecting a parameter increment with the greatest potential impact on the control variable; at operation 1210, determining whether the control variable is within specification; at operation 1212, if yes, repeating operations 1206 and 1208, or if no, applying the selected parameter increment, at operation 1212; at operation 1214, determining whether the control variable is within specification after application of the selected parameter increment. If yes, the method 1200 includes repeating operations 1206 and 1208. If no, the example method 1200 includes, at operation 1216, identifying a second adjustment parameter (for example, gas flow settings) that can affect the value of the identified control variable, and repealing, at operations 1218 through 1226, the control operations summarized above for the second adjustment parameter. Once selected increments in the first and second adjustment parameters have established a golden value in the identified control variable, at 1218 the chamber is optimized for pressure matching.

Some examples include methods for determining a deviation from a golden curve in dynamic process control. An example operation in a method may include defining a time reference at the start of an ALD cycle (for example, a digital output signal for opening of valve for dosing of the chamber). Every data point collected thereafter at regular intervals (e.g., 1 ms, 10 ms, 50 ms, 100 ms) is compared to corresponding data in the golden curve. The deviation or error limits from the golden curve can be pre-defined based on experiments or based on a user specification. Once parameters are optimized for a particular measurement, for example chamber pressure, the impact of a change in the parameter on other control variables, for example precursor manifold pressure, is checked and adjusted if necessary. The Table 1300 in FIG. 13 provides examples of parameters that can be modified to match for different control variables.

Some examples herein enable dynamic parameter control to match actual measurements, for example chamber pressure, gas line pressure, temperature, delivered RF power to achieve substrate to substrate, lot to lot, and chamber to chamber matching. Some examples include an optimization of parameters to minimize measurement deviation from a golden curve or value. The optimized parameters may be different from chamber to chamber. The optimized parameters may be different at different accumulations to address other factors (for example, a drift). Some examples include software features (described more fully below) for performing parameter optimization for process control. The present process control methods may be performed regularly or intermittently, for example during continuous operations or at a tool start-up or planned maintenance. Parameter optimization may be performed in an assigned priority, and in some examples, may be based on control variables that are most impactful on a given process.

In further aspects, some examples include self-learning techniques for advanced monitoring of processes, in particular ALD and CVD processes, for example. These techniques seek to address monitoring issues that can arise when using conventional methods to control conventional devices. For example, an MFC is typically monitored around a set point for a set error range. Valve timing control typically monitors open and close times of ALD valves, which can toggle between open and closed states during a given cycle or process in a period as short as 50 ms. RF generation is typically measured and controlled based on forward and reflected power, which in turn is monitored within an error band. Chamber and other temperatures are controlled and monitored around a setpoint within an error band/percentage.

Conventional efforts to monitor process (as opposed to device) parameters include monitoring chamber pressure around a set point for a set error band. The error band is often set large enough to ignore the inherent fluctuations that occur during an ALD cycle. Hence, these efforts do not truly monitor more detailed aspects or chamber conditions during an ALD cycle. Detailed and deep chamber control is becoming increasingly used to enable the creation of high-aspect nanosized substrate formations and semiconductor devices. Furthermore, precursor manifold and burst purge pressures are also typically monitored around a band. Conventional error bands are typically set too wide to capture smaller fluctuations during an ALD cycle, leading to similar challenges discussed above.

In terms of delivered RF power, a one-time check of RF power simply checks if RF is on or off after an RF strike. A voltage-current (VI) sensor monitors RF power during a plasma "on" step and simply monitors at a higher frequency than the RF power (for example, at 1 kHz). Thus, viewed broadly, current methods are based on limit or error band setting. It is a passive or "dumb" monitoring method typically based on limited data. Typically, monitoring bands are very wide, which does not solve or even address the problem of tight process control in the ever-demanding requirements of present-day semiconductor manufacturing. In other drawbacks, the same monitoring bands are applied to all tools, and no tool to tool modification or customization is done. Typically, any customization is performed manually on an ad hoc basis. Little or no substrate to substrate or tool to tool performance or comparison, whether to account for accumulation, after preventive maintenance, or after a hardware change, is typically performed in conventional techniques.

Figure 14:
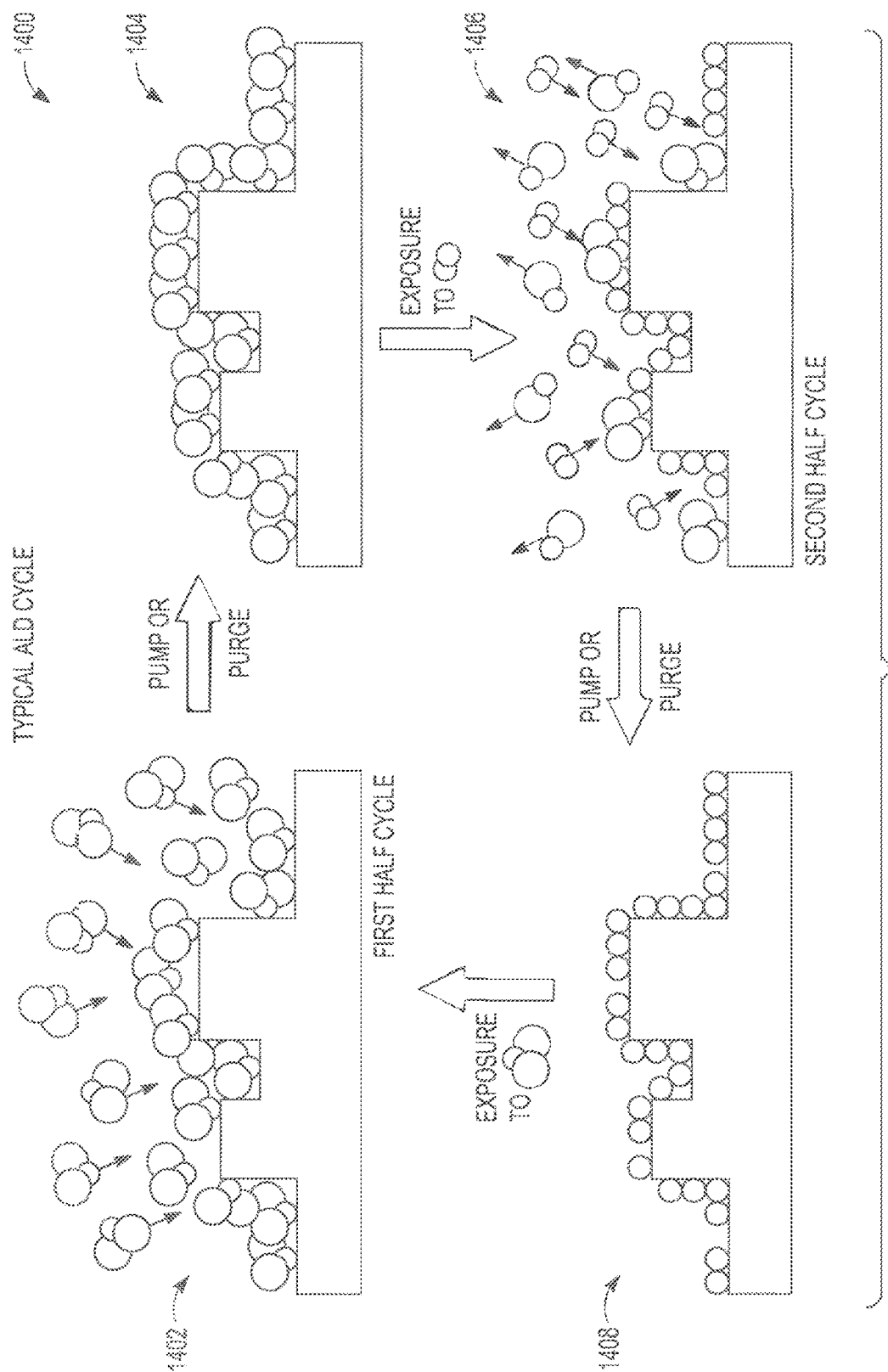
FIG. 14 depicts steps in an ALD cycle, according to example embodiments.

As mentioned above, an ALD process can be considered a multi-step process. With reference to FIG. 14, a typical ALD cycle 1400 includes four primary steps: dose 1402, purge 1404, conversion 1406, and purge 1408. In some present examples, each step in an ALD cycle, and subsequent cycles in a given ALD process, is individually monitored for different variables. The monitored variables are matched in each ALD step and/or cycle using curve fitting or a defined error margin in a "smart" self-learning monitoring process. Every ALD cycle is rendered repeatable, and parameters such as chamber pressure, precursor manifold pressure, temperature, and so forth can be monitored for repeatability (and made repeatable) for every cycle or step.

Figure 15:
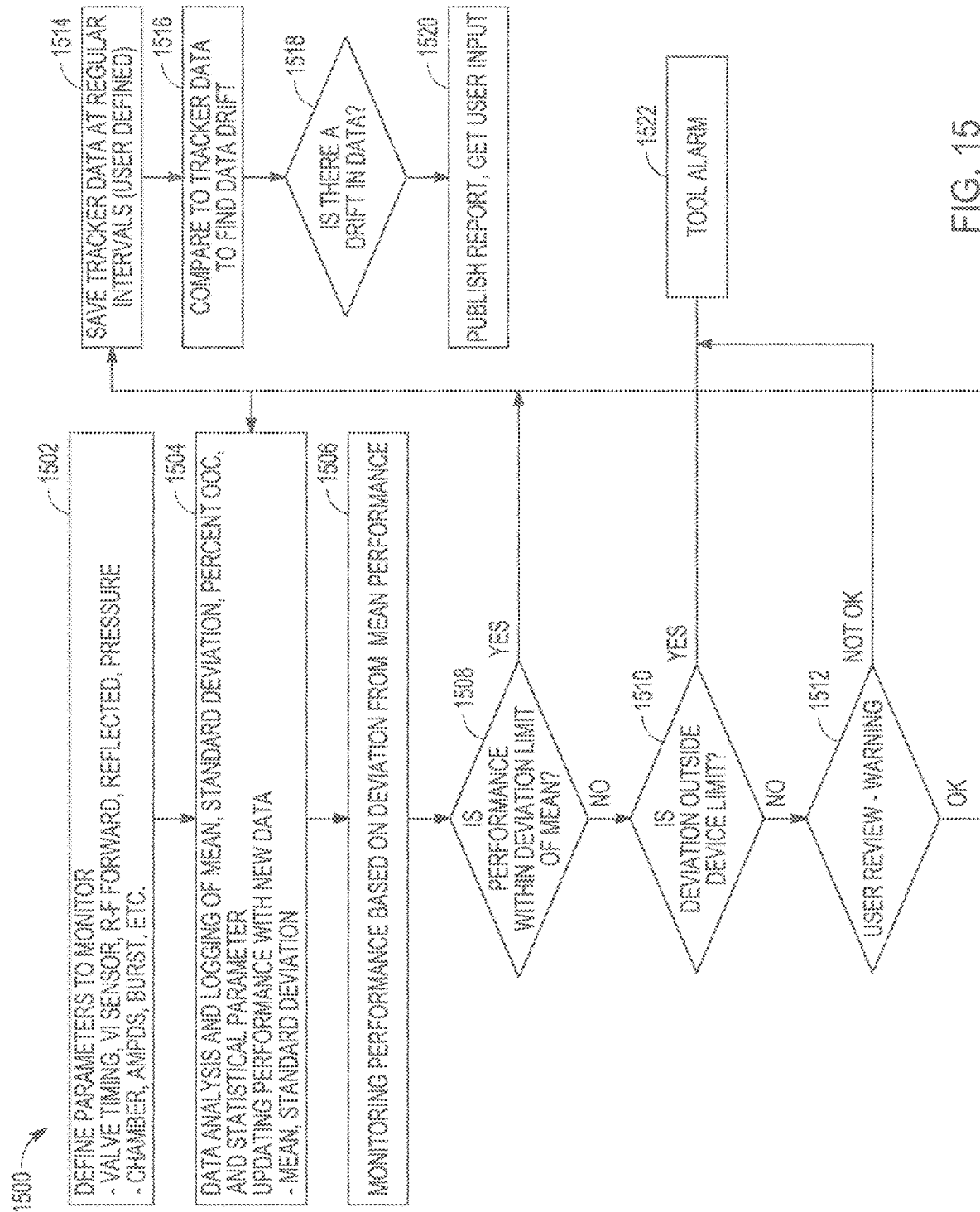
FIG. 15 depicts operations in a self-learning monitoring method, according to example embodiments.

Operations 1502-1522 in an example self-learning monitoring method 1500 are shown in FIG. 15, The method 155 includes, at operation 1502, defining one or more parameters to monitor, for example valve timing, VI sensor, RE-forward, RF reflected, pressure (such as chamber, precursor manifold, or burst pressures), and other parameters. Initial data is collected to compare with starting values and to define a basic goodness and may include a golden value or curve. A golden curve may be, for example, as shown in FIG. 3. Operation 1504 includes data analysis and logging of aspects such as mean values, standard deviation, a percentage out-of-control (OOC), and other statistical values. Operation 1504 may further include updating performance data with new data such as the derived statistical values.

Operation 1506 may include monitoring chamber performance based on a deviation from one or more statistical values, such as a mean performance. Operation 1508 may include determining whether the deviation is within a device limit. If yes, earlier operations such as operation 1504 may be repeated. Operation 1510 may include determining whether the deviation is outside a device limit. If no, operation 1512 includes issuing a user review warning. Upon review, if OK, earlier operations in the method may be repeated as shown. If not OK, operation 1522 includes issuing a tool alarm. Operation 1514 may include saving tracker data at regular intervals (as may be user defined). Operation 1516 includes comparing the performance data to the tracker data to identify a data draft. Based on the comparison, operation 1518 includes identifying if there is a drift in the data. If yes, operation 1520 includes issuing a report to obtain user input and correctional action.

Figure 16:
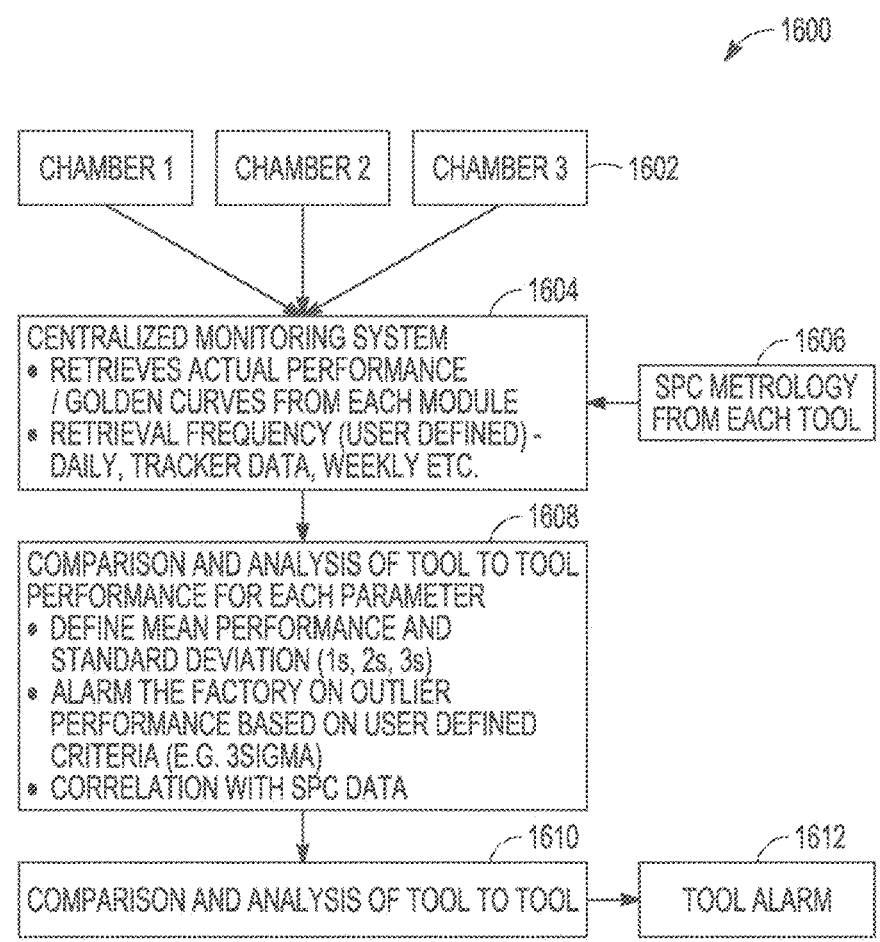
FIG. 16 depicts operations in a data harvesting method, according to example embodiments.

Example self-learning monitoring methods may include harvesting data from multiple systems to define a within-spec chamber performance for chamber to chamber and tool to tool performance matching. Example operations 1602-1612 in a data harvesting method 1600 are shown in FIG. 16. At operation 1602, multiple systems (for example, processing chambers) are identified. At operation 1604, a monitoring system retrieves actual performance or golden curve values of parameters from selected modules in the identified processing chambers (or tools). A retrieval frequency is identified. A retrieval frequency may be user defined, daily, based on tracker data, or weekly, for example.

In operation 1606, statistical process control (SPC) metrology from each chamber or tool is obtained. Operation 1608 includes performing a comparison and analysis of chamber to chamber (or tool to tool) performance for each of the relevant parameters and defining a mean performance and standard deviation values for each chamber (for example, chambers 1-3 in the view), Operation 1608 may include generating an alarm on outlier performance based on user defined criteria (for example, 3 sigma) and establishing a correlation with the obtained SPC data. Operation 1610 includes performing an overall chamber to chamber (or tool to tool) comparison and analysis and, in operation 1612, issuing a tool alarm if appropriate.

In some examples, a smart self-learning monitoring system includes machine learning components that create monitoring processes based on machine-learned models. The components may include a data preprocessing component. The preprocessing component receives training data sourced, for example, from a processing chamber or a set of golden values or curves (for example, of the type depicted in FIG. 3). The preprocessing component preprocesses the training data, including, for example, applying a MapReduce function or similar functionality to the training data. A feature extraction component may then act to extract a plurality of features (such as process parameters) from the preprocessed training data and teed these features into a machine learning algorithm. The extracted features may relate to one or more of the control variables discussed above. In some examples, the machine learning algorithm learns weights assigned to each of the features and applies these weights to a function. The function and the learned weights may be comprised in or constitute a machine-learned model discussed above. One or more machine-learned models are stored in a file system and retrieved when needed to perform analysis of chamber performance or process monitoring.

The machine learning algorithm may be selected from among many different potential supervised or unsupervised machine learning algorithms. Examples of supervised machine learning algorithms include artificial neural networks, Bayesian networks, instance-based learning, support vector machines, random forests, linear classifiers, quadratic classifiers, k-nearest neighbor, decision trees, and hidden Markov models. Examples of unsupervised machine learning algorithms include expectation-maximization algorithms, vector quantization, and information bottleneck methods. In an example embodiment, a binary logistic regression model is used. Binary logistic regression deals with situations in which the observed outcome for a dependent variable can have only two possible types. Logistic regression is used to predict the odds of one case or the other being true based on values of independent variables (predictors). In a further example embodiment, a boosted tree gradient descent process is utilized for the machine learning.

A function contained in a machine-learned model may be evaluated at runtime to produce a process matching score. The matching score is a prediction of the likelihood that an attempt to match conditions in multiple systems will result in a successful matching, based on evaluating various parameters and applying the feature weights learned by the machine learning algorithm to the features. In some examples, a predicted matching may include a hybrid result, or an output comprising a parameter adjustment that, with improved confidence, will result in a chamber to chamber or tool to tool matching.

In further examples, systems and methods including hardware and software are provided to determine gas line charge times. In some example deposition or etch systems, gases are delivered from gas boxes and include several valves and filters between gas sources and the deposition or etch chamber. Typically, an MFC, MFC inlet and outlet valve, a filter, and a chamber inlet valve are utilized in this regard. The travel time of the gas from a particular valve to the chamber can be defined as a gas line charge time.

In some examples, a gas line charge time may be affected by certain factors. The factors may include an MFC response and ramp time, with, in some examples, a ramp time taking 1 to 3 seconds for the associated gas flow to reach within +/−2% of a setpoint. The charge time factors may also include a valves open time. In some examples, a valve open time is in the range of a few milliseconds, including pneumatic delays and other delays. Some examples include a valve open time in the range<100 ms for a pneumatically operated valve. Other factors may include a conductance of the gas line, including a valve conductance, or pressure drop at a filter. Fundamentally the gas velocity depends on a pressure differential, which is in turn affected or determined by the conductance of the gas line. For deposition and etch processes, where sufficient time can be provided for a given gas line charge, any delays in gas line charges do not significantly affect the deposition or etch process, if at all.

As mentioned further above, an ALD process may include multiple steps that lead to film formation on a substrate surface. These steps may include a dose step in which precursor gas molecules stick to the substrate surface, a post-dose purge to remove excess precursor gas from the chamber, an application of RF power to strike a plasma and to convert the adsorbed monolayer of gas molecules on the surface to a film, and an RF purge to purge reaction by-products. The gases used in these steps typically emanate from various and different manifolds.

Currently, gas line charge times are not measured or monitored. Valve open and close times may be monitored using advance frequency (kHz) monitoring, ALD valves may include an optical sensor that detects the location of the valve diaphragm. The valve open and close timing is monitored by the difference in time of a command (Digital Input, DI) to a pneumatic bank that operates the valve and readback of the optical sensor (Digital Output, DO) sensing the diaphragm movement.

Figure 17:
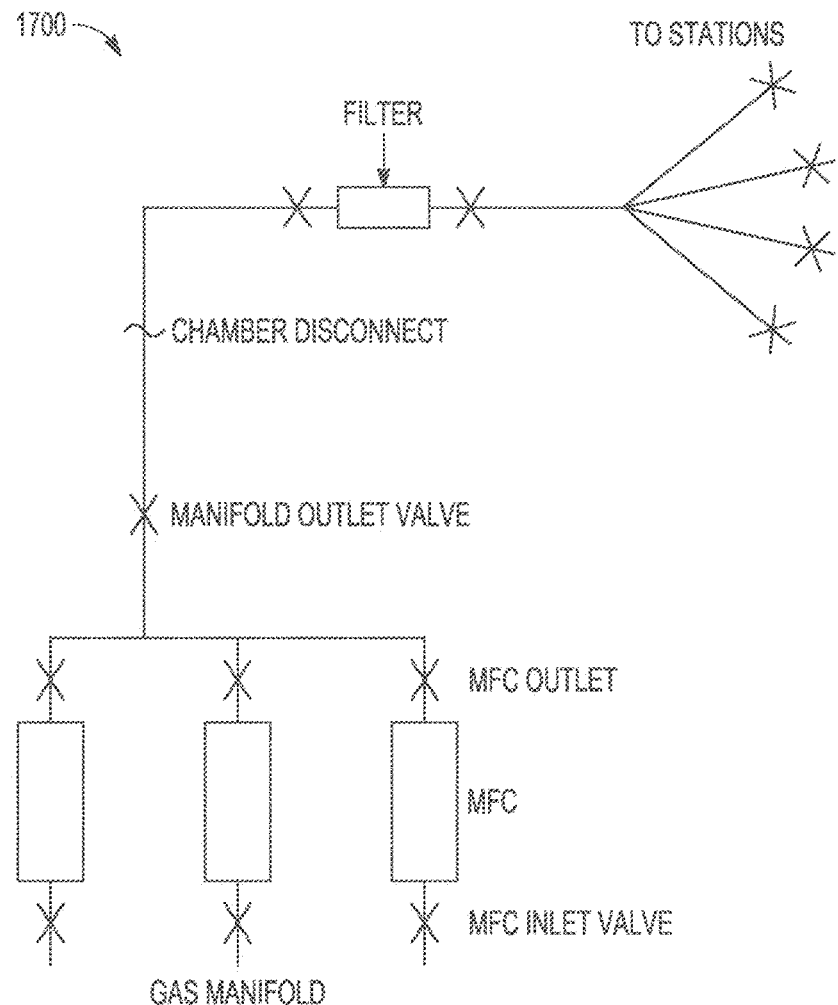
FIG. 17 depicts an arrangement of valves, according to an example embodiment.

For example, with reference to the arrangement 1700 of valves shown in FIG. 17, in a deposition or etch system, gases are delivered typically from gas boxes and several valves and filters may be provided between one or more gas sources and the deposition/etch chamber. Typically, the valves include an MFC, MFC inlet and outlet valve, a filter, and a chamber inlet valve. The travel time of the gas from a particular valve to the chamber can be defined as the gas line charge time. The gas line charge time depends on MFC response and ramp time. In some examples, valves typically take 1-3 seconds for gas flow to reach within +/−2% of a setpoint value. Valve opening times typically occur in the range of a few milliseconds. Including compressed dry air delays and other delays, valve opening times may be under 100 ms for a pneumatically operated valve. Valve conductance may include a pressure drop at a filter. Fundamentally, gas velocity depends on pressure differentials, which in turn are controlled by the conductance of the gas line. For deposition and etch processes in which enough time can be allowed for gas line charge, such delays in gas line charge may not matter to the deposition/etch process, but in some instances, gas line charge delays are unacceptable. The need for short ALD cycle times for high throughput (and deep substrate formation ability) means that the substrate processing operations cannot wait for an MFC ramp time or delay. Thus, in some examples, gas line charge times are determined to factor out their potential cause of delay or instability. Based upon such determined charge times, MFCs supplying the relevant gases are configured to operate in a continuous or consistent manner.

Figure 18:
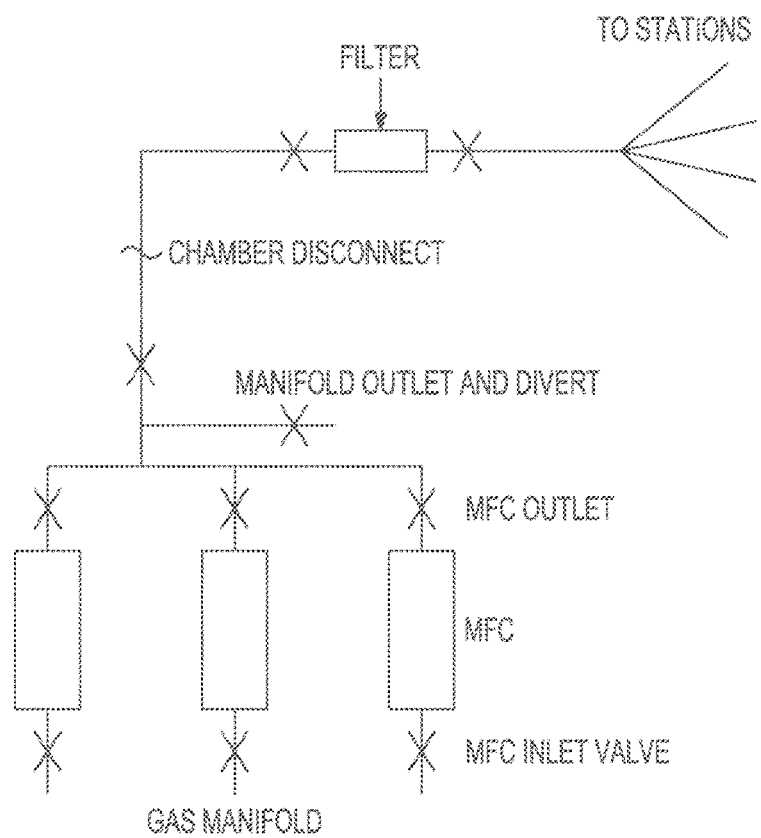
FIG. 18 is a schematic diagram of a common divert arrangement for a gas manifold, according to an example embodiment.
Figure 19:
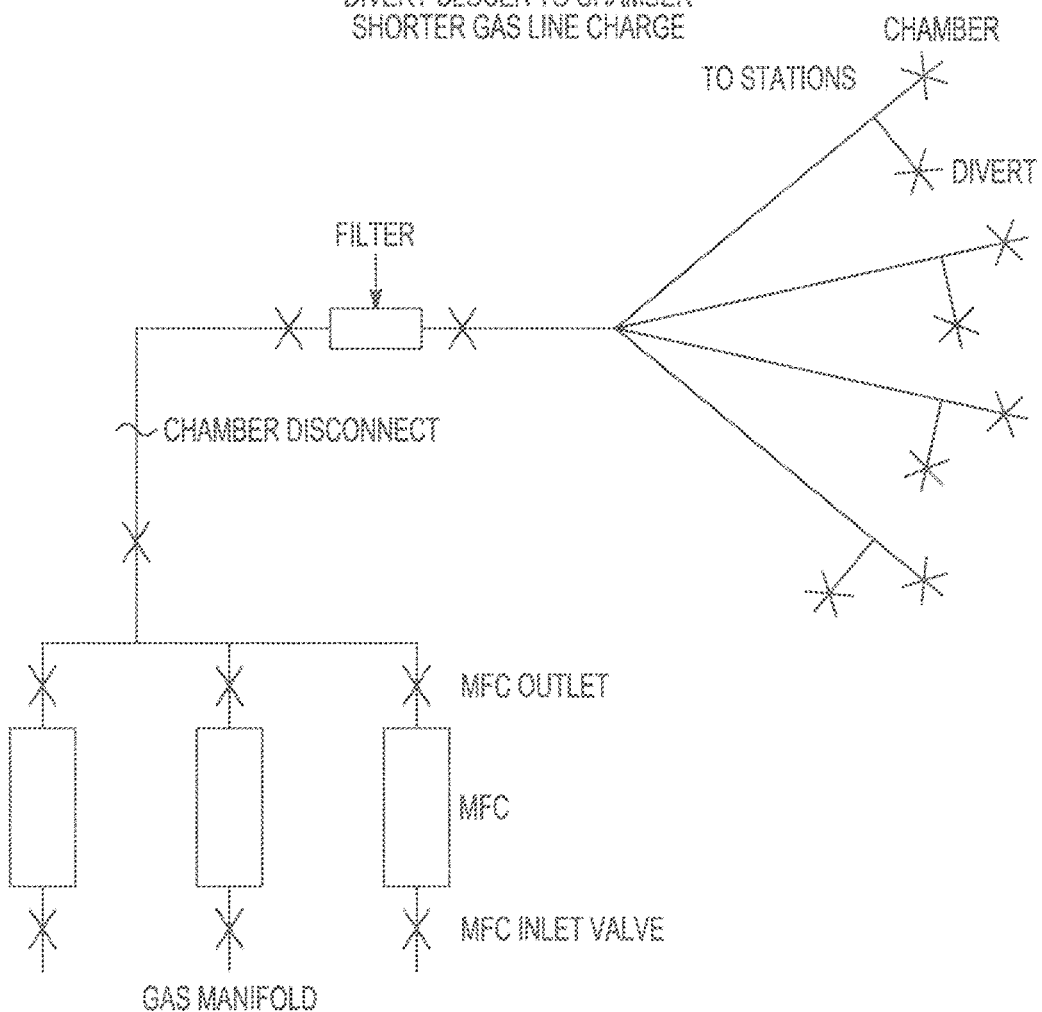
FIG. 19 is a schematic diagram of a localized station divert arrangement for a gas manifold, according to an example embodiment.

The existence of a divert (which allows gases to bypass the chamber, for example, to an exhaust or so-called fore line when not needed) can also affect gas line charge times. FIG. 18 is a schematic diagram of a common divert arrangement 1800 for a gas manifold. Gases are diverted away from the chamber and typically incur a relatively longer gas line charge. FIG. 19 is a schematic diagram of an individual station divert arrangement 1900 for a gas manifold. Gases are diverted closer to the chambers and typically incur a relatively shorter gas line charge.

In ALD processes, an individual step time may include a gas line charge time from the nearest outlet valve to the processing chamber. Some example embodiments therefore seek to address a complex and critical need in being able to provide consistent tool to tool, measurable gas line charge times.

Some example embodiments automatically measure gas line charge time at various times (for example at start-up, after preventive maintenance, or at regular intervals). The current measurements are automatically compared with previous measurements and any shifts in gas line charge times are reported. More broadly, measurements can also be compared to gas line charge times derived from other tools to determine tool to tool variation and a tool fitness or status.

Some examples measure or monitor gas line charge times using a chamber manometer. For example, a difference in time between the opening of a manifold outlet valve and the increase in chamber pressure is used in some examples to measure or calculate gas line charge times. Some example methods include establishing a base or constant pressure in a processing chamber supplied by a gas pump. The method includes closing the throttle and/or divert valve of the pump to isolate the chamber from the pump. The gas flow is setup to divert from the applicable manifold or gas line for which a line charge time is sought to be measured. The method further includes opening the gas manifold outlet valve and closing the divert valve and measuring the increase in chamber pressure. Typically, there will be some initial delay before the chamber pressure starts increasing. The pressure ramp curve is used in some examples can be used to calculate a gas line charge time, or delay. In other words, the initial delay in pressure ramp indicates the gas line charge time to the chamber. The calculated delay (charge time) can be factored into control and monitoring systems and methods, including gas admission algorithms, to enhance steady operation of a substrate processing chamber and chamber matching operations.

Figure 20:
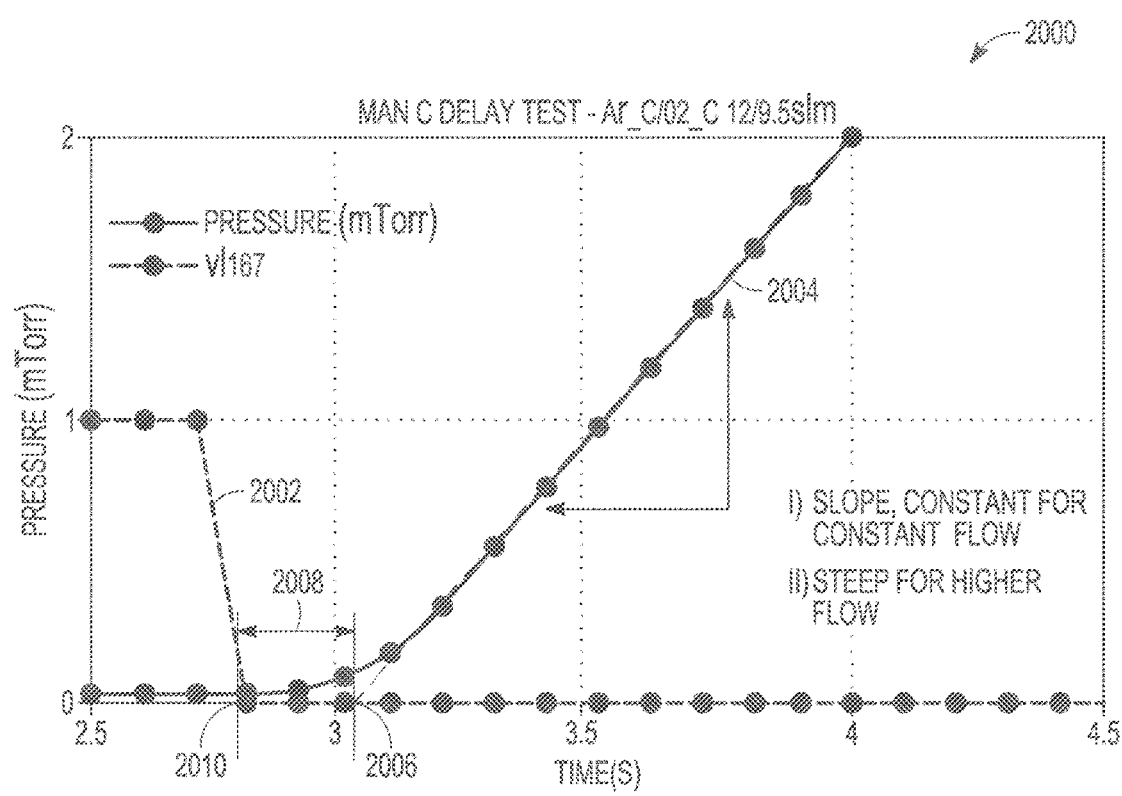
FIG. 20 shows aspects of a method for determining a gas line charge time, according to example embodiments.

An example method for determining a gas line charge time is now described with reference to the graph 2000 in FIG. 20. The graph includes a line 2002 that represents movement (closing or opening) of a gas valve supplying or removing gas from a processing chamber. In this case, the example valve is a divert valve, as indicated in the graph key. The divert valve controls gas in a line that bypasses the chamber. If the divert valve is closed, gas is not diverted from the chamber and is instead made available to enter the chamber. Gas enters the chamber and pressure within the chamber builds up. Typically, a closing of the divert valve coincides with an opening of a chamber supply valve to admit the supply into the chamber. In any event, in the present example, a gas line charge time for the divert valve is being established.

The line 2002 represents a physical closure of the divert valve from an open (divert) position at position "1" on the y-axis to a closed position at "0" on the same axis. When the divert valve closes, pressure in the chamber builds up as described above. This build up is represented by the pressure line 2004 in the graph 2000. After a period of time, the slope of the line 2004 becomes constant, i.e., represents a uniform or steady gas pressure build up in response to a constant or steady admission of gas into the chamber. The slope of the line 2004 will increase for higher gas flows. A gas line charge time is determined by extrapolating the slope of the line 2004 until it crosses the x-axis. This intersection is denoted by the position 2006 in the graph 2000. The gas line charge time is the period represented by the time line 2008 extending between the intersection point 2006 and the final closure of the divert valve represented by position 2010. In other words, there is a ramp up or delay time (i.e., a gas line charge time) between the closing of the divert valve (i.e., full admission or a maximum charge of gas into the chamber) and the point at which pressure within the chamber builds up at a constant rate.

In sonic embodiments, a gas decay time is identified. A closing of a gas outlet valve does not imply immediate stoppage of gas flow to the chamber There can be a delay in instructing a valve to close and a delay in the valve physically reaching full closure, in addition to delays incurred by other components. Even when the valve is closed, gases downstream of it already in the gas line still continue to the chamber.

In some examples, a method of establishing a gas decay (or dwell) time may include one or more of the following operations. Initially, a chamber is implemented at a base pressure or a constant pressure. The chamber is supplied by a throttle and slit valve controlling admission of gas from a supply pump. The supply throttle and slit valve supplying the chamber are closed to isolate the chamber from the supply pump. Gas flow is set up to divert from the manifold or gas line for which the gas decay time is sought to be measured. The gas manifold outlet valve is opened and the divert valve is closed. An increase in the chamber pressure is measured. The divert valve is then opened, and the gas outlet valve closed. The method then includes measuring the time for the chamber pressure to maximize or stabilize. This time to maximize or stabilize period is a measure of how long it takes (i.e., a gas decay or dwell time) for the gas to stop flowing to the chamber after the valve close instruction is sent to the outlet valve.

Figure 21:
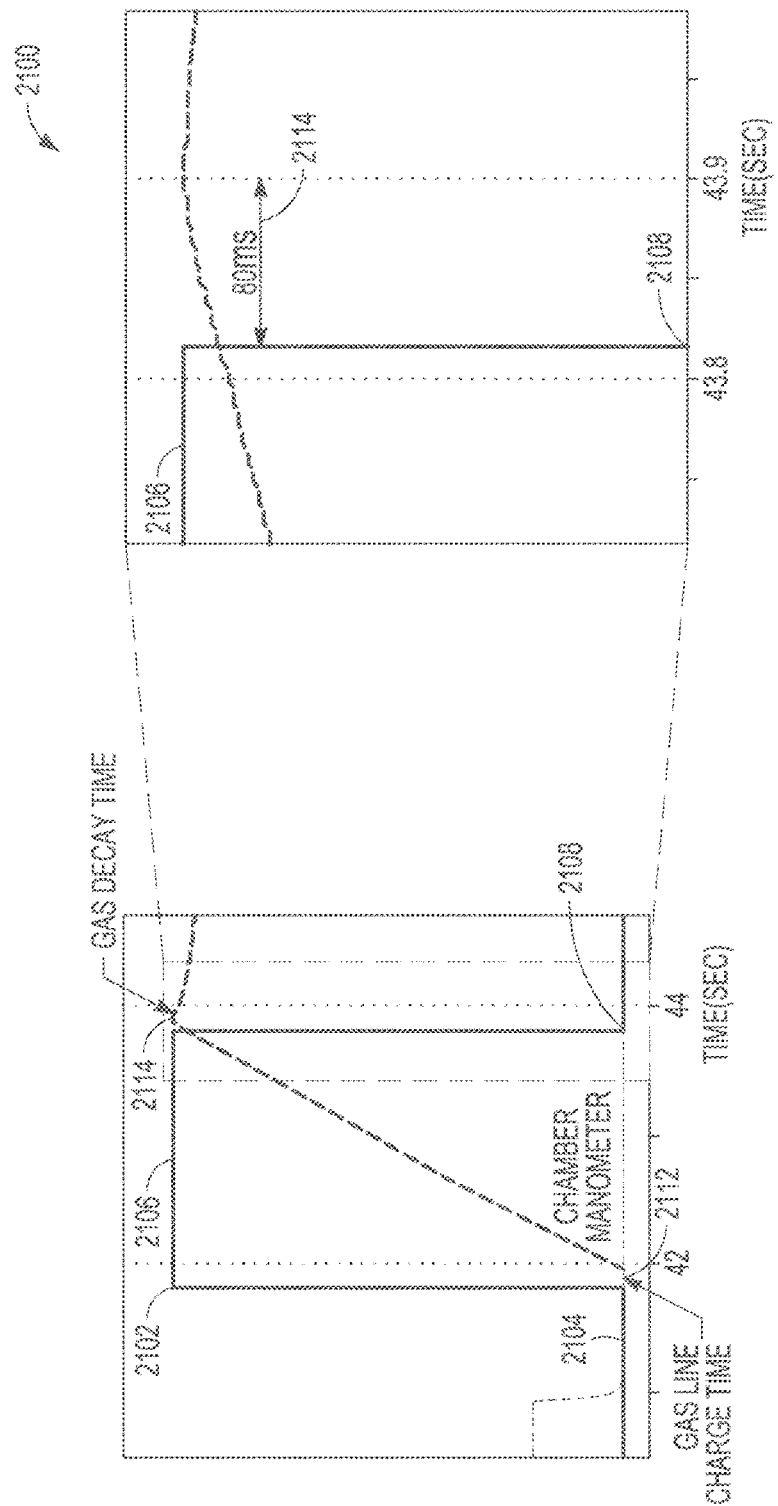
FIG. 21 depicts aspects of a method for determining a gas decay (or dwell) time, according to example embodiments.

A graph 2100 depicting an example gas line charge time and an example gas decay time is shown in FIG. 21. The line 2102 in the graph represents an opening and closing of a valve supplying a processing chamber. The valve is closed during the time period indicted at 2104. The valve is open during the time period 2106 and admits gas to the chamber causing a pressure build up within the chamber. The valve is closed again at 2108. The chamber pressure is measured by a chamber monometer and is represented by the pressure line 2110. As described above, a gas line charge time may be determined from the time period or delta indicated at 2112 (i.e., a period between an intersection of an extrapolation of the slope of the pressure and the x-axis, and the moment of instructing the valve to open at 2102). A gas decay time is determined from the time taken to reach stabilization after the valve closes at 2108. This gas decay time may be visible more clearly in the expanded view at 2114 (in this instance 80 ms).

Some examples thus provide methods for measuring gas line charge time using chamber pressure and methods for measuring gas decay (or dwell) time using chamber pressure. These values may be integrated into dynamic monitoring processes and software for automated parameter measurement, chamber control, and matching techniques. The charge and decay (dwell) values can be important in monitoring tool to tool (or chamber to chamber) variability and day to day drift in gas line charge or decay over time. Such methods may be applied to product lines which employ multi-step procedures cycles) for deposition or etch and require very fast step and cycle times. Faster step and cycle times can make gas line charge and decay times critical. Present embodiments enable their measurement and monitoring.

Figure 22:
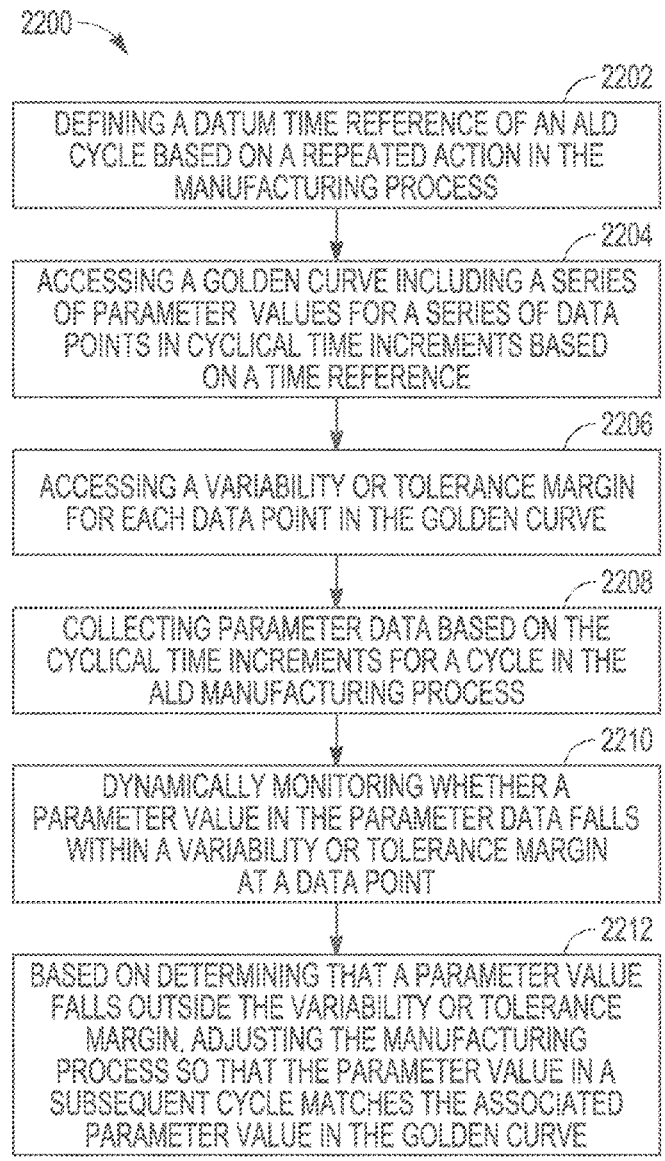
FIGS. 22-25 depict flow charts of example operations in methods, according to example embodiments.

Example embodiments may include methods. With reference to FIG. 22, a method 2200 for monitoring processing cycles in an ALD semiconductor manufacturing process includes at operation 2202, defining a datum time reference of an ALD cycle based on a repeated action in the manufacturing process; at operation 2204, accessing a golden curve including a series of parameter values for a series of data points in cyclical time increments based on a time reference; at operation 2206, accessing a variability or tolerance margin for each data point in the golden curve; at operation 2208, collecting parameter data based on the cyclical time increments for a cycle in the ALD manufacturing process; at operation 2210, dynamically monitoring whether a parameter value in the parameter data falls within a variability or tolerance margin at a data point; at operation 2212, based on determining that a parameter value falls outside the variability or tolerance margin, adjusting the manufacturing process so that the parameter value in a subsequent cycle matches the associated parameter value in the golden curve.

In some examples, the repeated action, forming the basis of the datum time reference, includes an opening or closing of a specified valve supplying the processing chamber.

In some examples, the parameter data is collected at regular intervals based on a collection frequency, the collection frequency being in the range 0-1 Hz, or 1-10 Hz, or 10-100 Hz, or 100-1000 Hz.

In some examples, the regular intervals are based on trigger points in the ALD manufacturing process, each trigger point defining or based on a time point in a step within the ALD manufacturing process.

In some examples, the operations further comprise comparing the parameter data collected at the trigger points with a corresponding set of parameter data in the golden curve.

In some examples, the parameter data includes parameter values associated with one or more of a precursor manifold pressure, a purge pressure, a conversion manifold pressure, a chamber pressure, a gas flow, an RF reflected power, and an RF forward power.

Figure 23:
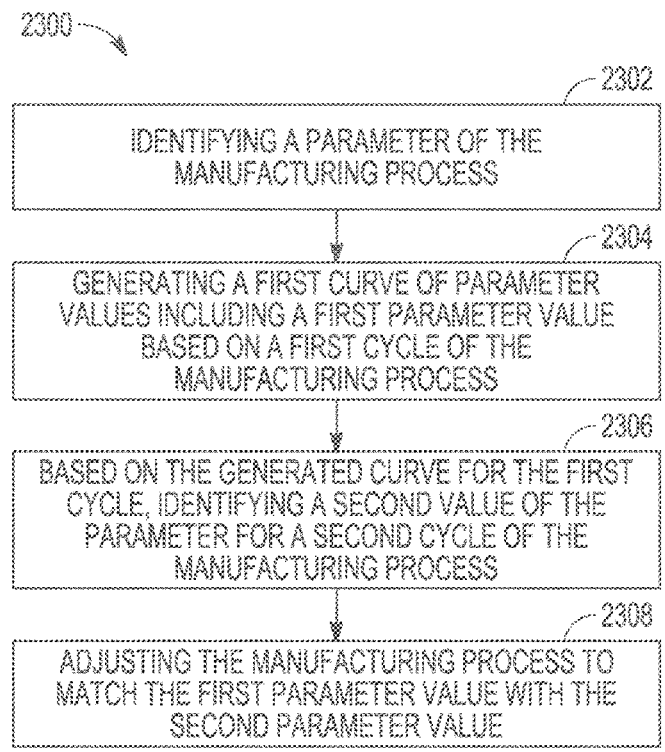

With reference to FIG. 23, a method 2300 for monitoring processing cycles in a semiconductor manufacturing process includes: at operation 2302, identifying a parameter of the manufacturing process; at operation 2304, generating a first curve of parameter values including a first parameter value based on a first cycle of the manufacturing process; at operation 2306, based on the generated curve for the first cycle, identifying a second value of the parameter for a second cycle of the manufacturing process; and operation 2308, adjusting the manufacturing process to match the first parameter value with the second parameter value.

In some examples, the operations further comprise: generating a second curve including a plurality of parameter values derived from the second cycle of the manufacturing process; and curve fitting the second curve of parameter values with the first curve of parameter values.

In some examples, the curve fitting operation includes: fitting a series of curves of parameter values, based on or derived from third and subsequent cycles of the manufacturing process, with the first or second curve to generate a golden curve defining a set of golden parameter values for the manufacturing process.

In some examples, each cycle of the manufacturing process includes a plurality of steps in an ALD process; and the operations further comprise: matching a parameter value in each step of the ALD process with a parameter value in the set of golden parameter values.

In some examples, the golden curve includes golden parameter values for each step in the ALD process.

In some examples, the identified parameter is associated with a control variable of the manufacturing process; and the operations further comprise: using the first and second parameters values, directly or indirectly, to identify a matching value of the control variable in the second cycle with a value of the control variable in the first cycle; and adjusting the manufacturing process to match the first parameter value with the second parameter value.

Figure 24:
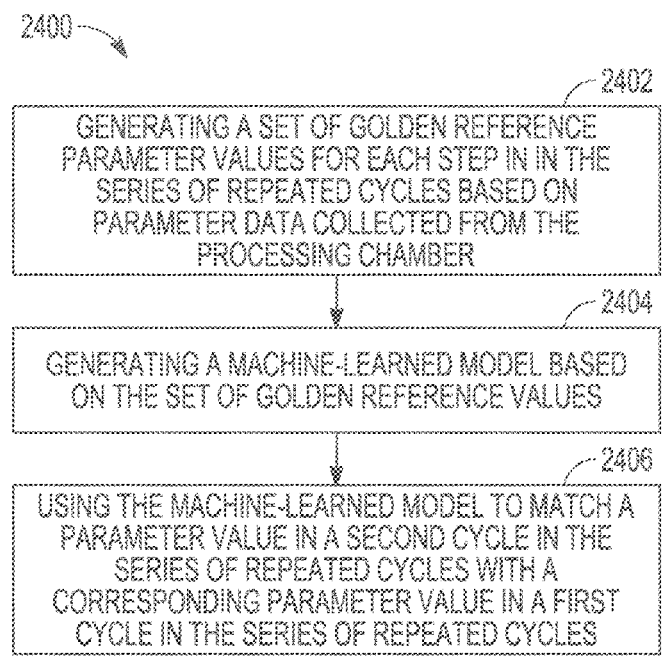

With reference to FIG. 24, a machine-learning method 2400 for monitoring processing steps in a semiconductor manufacturing cycle includes: at operation 2402, generating a set of golden reference parameter values for each step in in the series of repeated cycles based on parameter data collected from the processing chamber; at operation 2404, generating a machine-learned model based on the set of golden reference values; and, at operation 2406, using the machine-learned model to match a parameter value in a second cycle in the series of repeated cycles with a corresponding parameter value in a first cycle in the series of repeated cycles.

In some examples, the semiconductor manufacturing process is an ALD process; and the steps of each cycle in the series of repeated cycles include sequential steps comprising dose, purge, conversion, and purge steps.

In some examples, the operations further comprise: generating a golden curve including parameter value data for each sequential step; and using the golden curve as training data for the machine-learned model.

In some examples, the operations further comprise: based on the machine-learned model, repeating and matching each cycle in the series of repeated cycles by matching parameter values in each sequential step of the second cycle with corresponding parameter values of each sequential step of the first cycle.

In some examples, the parameters include one of more of a precursor manifold pressure, a purge pressure, a chamber pressure, a gas flow, a chamber temperature, an RF reflected power, and an RF forward power.

In some examples, the operations further comprise: collecting performance data from the processing chamber; identifying a drift in the performance data and generating performance drift data; and incorporating the drift data into training data for the machine-learned model.

Figure 25:
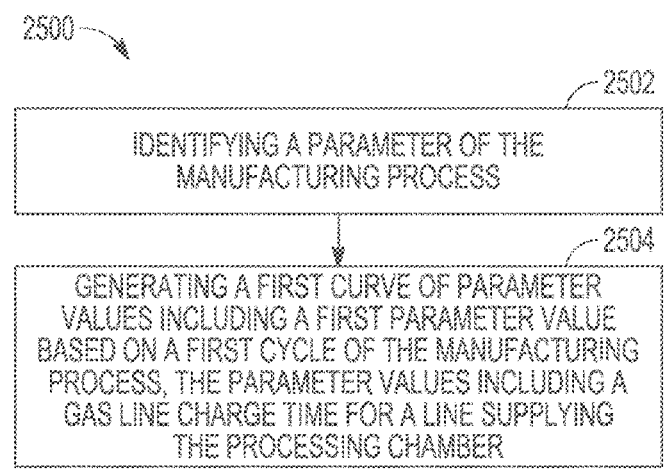

With reference to FIG. 25, a method 2500 for monitoring processing cycles in a semiconductor manufacturing process includes: at operation 2502, identifying a parameter of the manufacturing process; and at operation 2504, generating a first curve of parameter values including a first parameter value based on a first cycle of the manufacturing process, the parameter values including a gas line charge time for a line supplying the processing chamber.

In some examples, the operations further comprise: calculating the gas line charge time based on a pressure ramp up time between an opening of a valve in the line supplying the processing chamber and establishment of constant pressure increase thereafter.

In some examples, the operations further comprise: based on the generated curve for the first cycle, identifying a second value of the parameter for a second cycle of the manufacturing process; generating a second curve including a plurality of parameter values derived from the second cycle of the manufacturing process; and curve fitting the second curve of parameter values with the first curve of parameter values.

In some examples, the curve fitting operation includes: fitting a series of curves of parameter values, based on or derived from third and subsequent cycles of the manufacturing process, with the first or second curve to generate a golden curve defining a set of golden parameter values for the manufacturing process.

In some examples, each cycle of the manufacturing process includes a plurality of steps in an ALD process; and wherein the operations further comprise: matching a parameter value in each step of the ALD process with a parameter value in the set of golden parameter values.

In some examples, the golden curve includes golden parameter values for each step in the ALD process.

In some examples, the identified parameter is associated with a control variable of the manufacturing process; and the operations further comprise: using the first and second parameters values, directly or indirectly, to identify a matching value of the control variable in the second cycle with a value of the control variable in the first cycle and adjusting the manufacturing process to match the first parameter value with the second parameter value.

Figure 26:
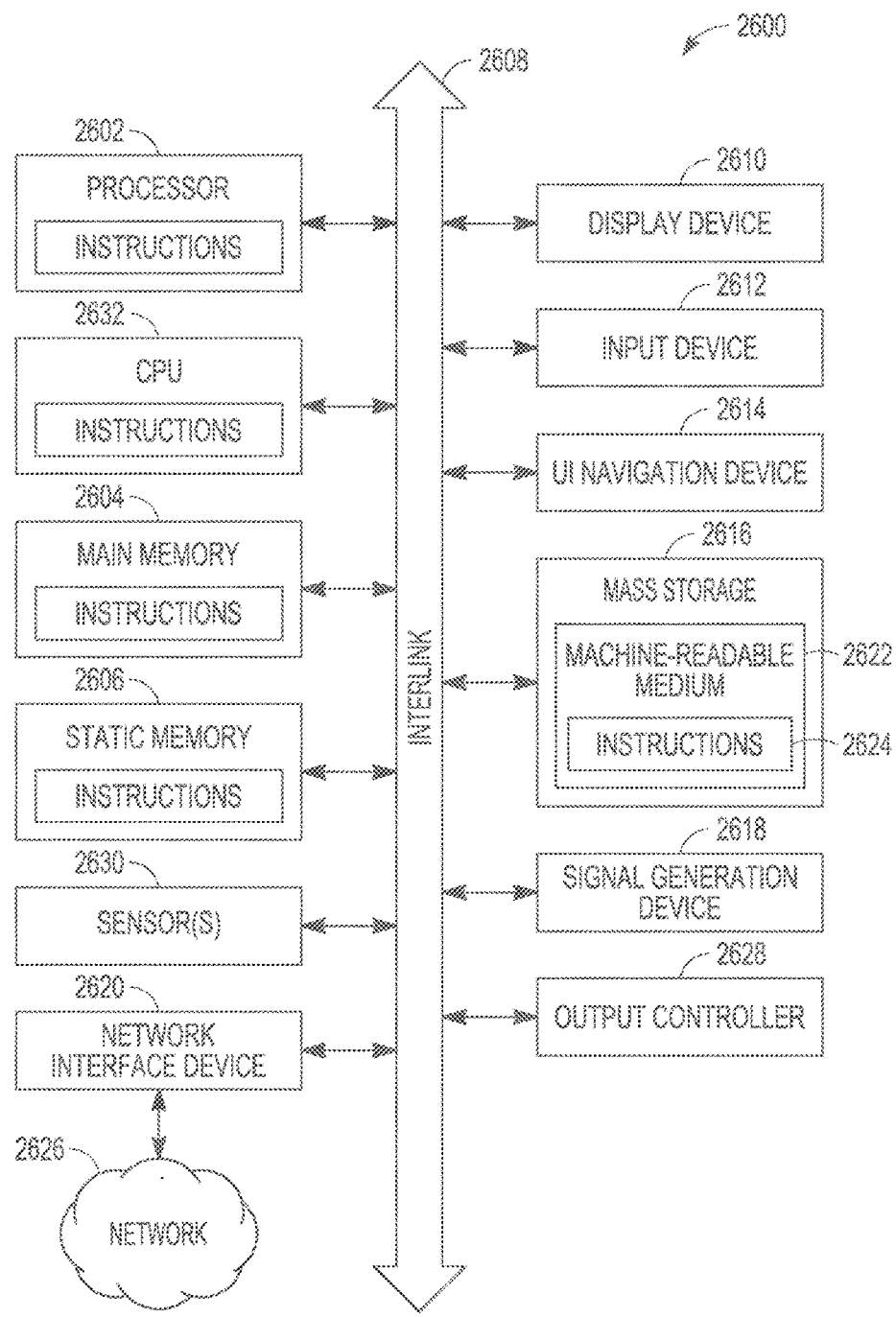
FIG. 26 is a block diagram illustrating an example of a machine upon which one or more example embodiments may be implemented, or by which one or more example embodiments may be controlled.

FIG. 26 is a block diagram illustrating an example of a machine 2600 by which one or more example process embodiments described herein may be controlled. In alternative embodiments, the machine 2600 may operate as a standalone device or may be connected (e.g., networked) to other machines. In a networked deployment, the machine 2600 may operate in the capacity of a server machine, a client machine, or both in server-client network environments. In an example, the machine 2600 may act as a peer machine in a peer-to-peer (P2P) (or other distributed) network environment. Further, while only a single machine 2600 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations. In some examples, and referring to FIG. 26, a non-transitory machine-readable medium includes instructions 2624 that, when read by a machine 2600, cause the machine to control operations in methods comprising at least the non-limiting example operations summarized above and described herein.

Examples, as described herein, may include or may operate by logic, or a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 2600 may include a hardware processor 2602 (e.g., a central processing unit (CPU), a hardware processor core, or any combination thereof), a graphics processing unit (GPU) 2632, a main memory 2604, and a static memory 2606, some or all of which may communicate with each other via an interlink (e.g., bus) 2608. The machine 2600 may further include a display device 2610, an alphanumeric input device 2612 (e.g., a keyboard), and a user interface (UI) navigation device 2614 (e.g., a mouse). In an example, the display device 2610, alphanumeric input device 2612, and UI navigation device 2614 may be a touch screen display. The machine 2600 may additionally include a mass storage device (e.g., drive unit) 2616, a signal generation device 2618 (e.g., a speaker), a network interface device 2620, and one or more sensors 2630, such as a Global Positioning System (GPS) sensor, compass, accelerometer, or another sensor. The machine 2600 may include an output controller 2628, such as a serial (e.g., universal serial bus (USB)), parallel, or other wired or wireless (e.g., infrared (IR), near field communication (NFC), etc. connection to communicate with or control one or more peripheral devices (e.g., a printer, card reader, etc.).

The mass storage device 2616 may include a machine-readable medium 2622 on Which is stored one or more sets of data structures or instructions 2624 (e.g., software) embodying or utilized by any one or more of the techniques or functions described herein. The instructions 2624 may as shown also reside, completely or at least partially, within the main memory 2604, within the static memory 2606, within the hardware processor 2602, or within the GPU 2632 during execution thereof by the machine 2600, in an example, one or any combination of the hardware processor 2602, the GPU 2632, the main memory 2604, the static memory 2606, or the mass storage device 2616 may constitute machine-readable media 2622.

While the machine-readable medium 2622 is illustrated as a single medium, the term "machine-readable medium" may include a single medium, or multiple media (e.g., a centralized or distributed database, and/or associated caches and servers) configured to store the one or more instructions 2624.

The term "machine-readable medium" may include any medium that can store, encode, or carry instructions 2624 for execution by the machine and that cause the machine 2600 to perform any one or more of the techniques of the present disclosure, or that can store, encode, or carry data structures used by or associated with such instructions 2624. Non-limiting machine-readable medium examples may include solid-state memories, and optical and magnetic media. In an example, a massed machine-readable medium comprises a machine-readable medium 2622 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 2624 may further be transmitted or received over a communications network 2626 using a transmission medium via the network interface device 2620.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A system for monitoring processing cycles in a manufacturing process, the system comprising:
    a processing chamber for the manufacturing process; and
    one or more controllers configured to perform process monitoring operations, the operations comprising:
    identifying a parameter of the manufacturing process; and
    generating a first curve of parameter values including a first parameter value based on a first cycle of the manufacturing process, the parameter values including a gas line charge time for a line supplying the processing chamber.

2. The system of claim 1, wherein the operations further comprise:
    calculating the gas line charge time based on a pressure ramp up time between an opening of a valve in the line supplying the processing chamber and establishment of constant pressure increase thereafter.

3. The system of claim 2, wherein the operations further comprise:
    based on the generated curve for the first cycle, identifying a second value of the parameter for a second cycle of the manufacturing process;
    generating a second curve including a plurality of parameter values derived from the second cycle of the manufacturing process; and
    curve fitting the second curve of parameter values with the first curve of parameter values.

4. The system of claim 3, wherein the curve fitting operation includes:
    fitting a series of curves of parameter values, based on or derived from third and subsequent cycles of the manufacturing process, with the first or second curve to generate a golden curve defining a set of golden parameter values for the manufacturing process.

5. The system of claim 4, wherein the golden curve includes golden parameter values for each step in the ALD process.

6. The system of claim 4, wherein each cycle of the manufacturing process includes a plurality of steps in an ALD process; and
    wherein the operations further comprise:
    matching a parameter value in each step of the ALD process with a parameter value in the set of golden parameter values.

7. The system of claim 6, wherein the identified parameter is associated with a control variable of the manufacturing process; and
    wherein the operations further comprise:
    using the first and second parameters values, directly or indirectly, to identity a matching a value of the control variable in the second cycle with a value of the control variable in the first cycle, and
    adjusting the manufacturing process to match the first parameter value with the second parameter value.

8. A method for monitoring processing cycles in a manufacturing process, the method comprising:
    identifying a parameter of the manufacturing process; and
    generating a first curve of parameter values including a first parameter value based on a first cycle of the manufacturing process, the parameter values including a gas line charge time for a line supplying the processing chamber.

9. The method of claim 8, wherein the operations further comprise:
    calculating the gas line charge time based on a pressure ramp up time between an opening of a valve in the line supplying the processing chamber and establishment of constant pressure increase thereafter.

10. The method of claim 9, wherein the operations further comprise:
    based on the generated curve for the first cycle,
    identifying a second value of the parameter for a second cycle of the manufacturing process;
    generating a second curve including a plurality of parameter values derived from the second cycle of the manufacturing process; and
    curve fitting the second curve of parameter values with the first curve of parameter values.

11. The method of claim 10, wherein the curve fitting operation includes:
    fitting a series of curves of parameter values, based on or derived from third and subsequent cycles of the manufacturing process, with the first or second curve to generate a golden curve defining a set of golden parameter values for the manufacturing process.

12. The method of claim 11, wherein the golden curve includes golden parameter values for each step in the ALD process.

13. The method of claim 11, wherein each cycle of the manufacturing process includes a plurality of steps in an ALD process; and
    wherein the operations further comprise:
    matching a parameter value in each step of the ALD process with a parameter value in the set of golden parameter values.

14. The method of claim 13, wherein the identified parameter is associated with a control variable of the manufacturing process; and
    wherein the operations further comprise:
    using the first and second parameters values, directly or indirectly, to identity a matching a value of the control variable in the second cycle with a value of the control variable in the first cycle, and
    adjusting the manufacturing process to match the first parameter value with the second parameter value.

15. A machine-readable medium including instructions which, when read by a machine, cause the machine to perform operations comprising:
    identifying a parameter of a manufacturing process; and
    generating a first curve of parameter values including a first parameter value based on a first cycle of the manufacturing process, the parameter values including a gas line charge time for a line supplying the processing chamber.

16. The medium of claim 15, wherein the identified parameter is associated with a control variable of the manufacturing process; and wherein the operations further comprise:
using the first and second parameters values, directly or indirectly, to identify a matching a value of the control variable in the second cycle with a value of the control variable in the first cycle, and
adjusting the manufacturing process to match the first parameter value with the second parameter value.

17. The medium of claim 15, wherein the operations further comprise:
calculating the gas line charge time based on a pressure ramp up time between an opening of a valve in the line supplying the processing chamber and establishment of constant pressure increase thereafter.

18. The medium of claim 17, wherein the operations further comprise:
based on the generated curve for the first cycle,
identifying a second value of the parameter for a second cycle of the manufacturing process;
generating a second curve including a plurality of parameter values derived from the second cycle of the manufacturing process; and
curve fitting the second curve of parameter values with the first curve of parameter values.

19. The medium of claim 18, wherein the curve fitting operation includes:
fitting a series of curves of parameter values, based on or derived from third and subsequent cycles of the manufacturing process, with the first or second curve to generate a golden curve defining a set of golden parameter values for the manufacturing process.

20. The medium of claim 19, wherein each cycle of the manufacturing process includes a plurality of steps in an ALD process; and
wherein the operations further comprise:
matching a parameter value in each step of the ALD process with a parameter value in the set of golden parameter values.

21. The medium of claim 19, wherein the golden curve includes golden parameter values for each step in the ALD process.

* * * * *